US009300307B2

(12) United States Patent
Juneau et al.

(10) Patent No.: US 9,300,307 B2
(45) Date of Patent: Mar. 29, 2016

(54) ARBITRARY PHASE TRAJECTORY FREQUENCY SYNTHESIZER

(71) Applicant: DUST NETWORKS, INC., Hayward, CA (US)

(72) Inventors: Thor Nelson Juneau, Menlo Park, CA (US); Mark Alan Lemkin, Berkeley, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/616,192

(22) Filed: Feb. 6, 2015

(65) Prior Publication Data

US 2015/0229317 A1 Aug. 13, 2015

Related U.S. Application Data

(60) Provisional application No. 61/937,380, filed on Feb. 7, 2014.

(51) Int. Cl.
*H03L 7/18* (2006.01)
*H03C 3/09* (2006.01)
(Continued)

(52) U.S. Cl.
CPC .............. *H03L 7/18* (2013.01); *H03C 3/0925* (2013.01); *H03C 3/0933* (2013.01);
(Continued)

(58) Field of Classification Search
CPC .. H03C 3/0925; H03C 3/0933; H03C 3/0941; H03C 3/0966; H03C 3/0975; H03L 7/18; H03L 7/1806; H03L 7/0814
USPC .................. 327/105, 106, 107, 156, 158, 159
See application file for complete search history.

(56) References Cited

U.S. PATENT DOCUMENTS

| 7,015,738 B1 * | 3/2006 | Cao ...................... | H03C 3/0925 327/156 |
| 2004/0036539 A1 * | 2/2004 | Hammes .............. | H03C 3/0925 331/16 |

(Continued)

FOREIGN PATENT DOCUMENTS

WO 2006070224 A1 7/2006

OTHER PUBLICATIONS

Shanan, H., et al.: "A 2.4GHz 2Mb/s Versatile PPL-Based Transmitter Using Digital Pre-Emphasis and Auto Calibration in 0.18 µm CMOS for WPAN", ISSCC 2009 / Session 24 / Wireless Connectivity / 24-7, 2009 IEEE International Solid-State Circuits Conference, pp. 420-422.
Liu, Yao-Hong, et al.: "A Wideband PLL-Based G/FSK Transmitter in 0.18 µm CMOS", IEEE Journal of Solid-State Circuits, vol. 44, No. 9, Sep. 2009, pp. 2452-2462.

(Continued)

*Primary Examiner* — William Hernandez
(74) *Attorney, Agent, or Firm* — McDermott Will & Emery LLP

(57) ABSTRACT

A frequency synthesizer directly generates phase modulated radio-frequency (RF) signals. The frequency synthesizer includes a voltage controlled oscillator (VCO) producing a synthesized frequency signal having a frequency controlled based on a signal received at an input of the VCO. A digitally adjustable frequency divider produces a reduced frequency signal from the synthesized frequency signal. A phase digital-to-analog converter (DAC) produces a delayed version of a timing signal (e.g., the reduced frequency signal, or a reference clock signal) that is delayed according to a digital control signal. A phase detector (PD) produces a phase control signal from the reduced frequency signal and/or the delayed timing signal. A digital signal converter controls the digitally adjustable frequency divider and the phase DAC so as to cause a phase or frequency of the synthesized frequency signal output by the VCO to track a desired phase or frequency trajectory encoded in a digital signal.

20 Claims, 11 Drawing Sheets

(51) Int. Cl.
*H03L 7/081* (2006.01)
*H03K 3/03* (2006.01)

(52) U.S. Cl.
CPC .......... *H03C 3/0941* (2013.01); *H03C 3/0966* (2013.01); *H03C 3/0975* (2013.01); *H03L 7/0814* (2013.01); *H03K 3/0315* (2013.01)

(56) References Cited

U.S. PATENT DOCUMENTS

| | | | |
|---|---|---|---|
| 2004/0192231 A1* | 9/2004 | Grewing | H03C 3/0925 455/102 |
| 2005/0046488 A1* | 3/2005 | Grewing | H03C 3/0925 331/23 |
| 2007/0152766 A1 | 7/2007 | Herrin et al. | |
| 2009/0219100 A1* | 9/2009 | Pullela | H03C 3/0925 331/44 |
| 2010/0039182 A1* | 2/2010 | Galton | H03K 23/54 331/1 A |

OTHER PUBLICATIONS

Nuyts, Pieter A.J., et al.: "A Fully Digital Delay Line Based GHz Range Multimode Transmitter Front-End in 65-nm CMOS", IEEE Journal of Solid-State Circuits, vol. 47, No. 7, Jul. 2012, pp. 1681-1692.

Ravi, Ashoke, et al.: "A 2.4-GHz 20-40-MHz Channel WLAN Digital Outphasing Transmitter Utilizing a Delay-Based Wideband Phase Modulator in 32-nm CMOS", IEEE Journal of Solid-State Circuits, vol. 47, No. 12, Dec. 2012, pp. 3184-3196.

Zanuso, M., et al.: "A Wideband 3.6 GHz Digital ΔΣ Fractional-N PLL With Phase Interpolation Divider and Digital Spur Cancellation", IEEE Journal of Solid-State Circuits, vol. 46, No. 1, Mar. 2011, pp. 627-638.

Levantino, S., et al.: "An Adaptive Pre-Distortion Technique to Mitigate the DTC Nonlinearity in Digital PLLs", IEEE Journal of Solid-State Circuits, vol. 49, No. 8, Aug. 2014, pp. 1762-1772.

Extended European Search Report issued in Application No. 15000352.3 dated Jul. 10, 2015.

* cited by examiner

ARBITRARY PHASE TRAJECTORY FREQUENCY SYNTHESIZER

CROSS-REFERENCE TO RELATED APPLICATION

This application claims the benefit of U.S. Provisional Application No. 61/937,380, filed on Feb. 7, 2014, the disclosure of which is hereby incorporated by reference in its entirety.

TECHNICAL FIELD

The present subject matter relates to techniques and equipment providing improved transmitter and frequency synthesizer architectures that use arbitrary phase trajectory controllers to directly generate phase modulated radio-frequency (RF) signals.

BACKGROUND

Wireless communication ranging from WiFi to car door locks has become ubiquitous. Emerging technologies such as wireless sensor networks and the internet of things (IoT) are increasing the demand for wireless devices many-fold. In particular, wireless devices with low production costs, small size (i.e., high degree of miniaturization), and reduced power consumption are in high demand. Lowering the power consumption of and developing new power scavenging strategies for wireless devices is particularly important since long battery life is critical to many applications in these networks. In this regard, in order to develop smaller and less costly devices, both the radio and the accompanying central processing unit (CPU), flash memory, random access memory (RAM), and digital interface blocks of the wireless devices may need to shrink. In general, the devices can be miniaturized by following Moore's law and using ever smaller integrated circuit fabrication technologies. However, many radio architectures are not compatible with lower power supply voltages and reduced headroom voltages, with wider device mismatch, and with peculiar device behaviors resulting from small transistor feature sizes. Additionally, the large die area occupied by inductors prevalent in many traditional radio designs do not shrink at all with the minimum feature size of a technology.

Certain wireless transmitter architectures generate a pair of Cartesian baseband signals called in-phase (I) and quadrature-phase (Q) signals. The I and Q signals are nominally orthogonal, and the I and Q signals are combined and up-modulated to RF frequency in the transmitter using a mixer or an image-rejection mixer. The mixers typically require careful design and substantial power to produce accurate signals. The mixer output signals are amplified to full power for transmission using amplifiers. The signal transmission method using I and Q signals is particularly wasteful for low power modulation wireless standards such as IEEE 802.15.4 or Bluetooth which have a constant-amplitude envelope. In these standards, all of the transmission information is encompassed in the phase of the signal. An alternative approach is therefore needed which directly generates the phase without generating and processing an I-Q signal pair at baseband and then up-modulating to RF.

Hence, new circuit and device architectures are needed for providing transmitters and frequency synthesizer that are small and provide highly efficient transmission for use in wireless communication applications.

SUMMARY

The teachings herein alleviate one or more of the above noted problems by providing improved transmitter and frequency synthesizer architectures that use arbitrary phase trajectory controllers to directly generate phase modulated radio-frequency (RF) signals.

According to one aspect of the disclosure, a frequency synthesizer includes a voltage controlled oscillator (VCO) producing at an output thereof a synthesized frequency signal having a frequency controlled based on a signal received at an input of the VCO; a digitally adjustable frequency divider coupled to the output of the VCO and producing at an output thereof a reduced frequency signal from the synthesized frequency signal; a phase digital-to-analog converter (DAC) receiving a timing signal and a digital control signal, and producing at an output thereof a delayed version of the timing signal that is delayed according to the digital control signal; a phase detector (PD) coupled to the output of the digitally adjustable frequency divider, the output of the phase DAC, and a reference clock, and producing a phase control signal at an output coupled to the input of the VCO; and a digital signal converter operative to control the digitally adjustable frequency divider and the phase DAC so as to cause a phase or frequency of the synthesized frequency signal output by the VCO to track a desired phase or frequency trajectory encoded in a digital signal received by the digital signal converter.

The digital signal converter may determine when a delay threshold is reached by the phase DAC, and may adjust a frequency division of the digitally adjustable frequency divider in response to determining that the delay threshold is reached by the phase DAC. For example, when the digital signal converter determines that a maximum delay threshold is reached by the phase DAC, the digital signal converter may reduce the digitally adjustable delay of the phase DAC and increase the frequency division of the digitally adjustable frequency divider. For instance, when the digital signal converter determines that the maximum delay threshold is reached by the phase DAC, the digital signal converter may reduce the digitally adjustable delay of the phase DAC by a length of time equal to one period of the synthesized frequency signal output by the VCO. Further, when the digital signal converter determines that a minimum delay threshold is reached by the phase DAC, the digital signal converter may increase the digitally adjustable delay of the phase DAC and decrease the frequency division of the digitally adjustable frequency divider.

The phase DAC may receive as the timing signal the reduced frequency signal from the digitally adjustable frequency divider, and may output directly to the PD a delayed version of the reduced frequency signal.

The phase DAC may receive as the timing signal the reference clock signal, and may output to the PD a delayed version of the reference clock signal.

The frequency synthesizer may further include a charge pump coupled between the output of the phase detector and the input of the VCO, and operative to filter the phase control signal to provide a filtered phase control signal at the input of the VCO.

The digital signal converter may include a digital accumulator having a predetermined range. The digital signal converter may control the phase DAC based on a value stored in the accumulator, and control the digitally adjustable frequency divider based on an overflow or an underflow condition of the accumulator reaching an upper limit or a lower limit of the predetermined range.

The delayed version of the timing signal output by the phase DAC may control the input of the VCO via the PD.

The digitally adjustable frequency divider may be adjustable to increment, decrement, or hold steady a frequency ratio applied to the synthesized frequency signal.

According to another aspect of the disclosure, a method includes producing, in a voltage controlled oscillator (VCO) of a frequency synthesizer, a synthesized frequency signal having a frequency controlled based on a signal received at an input of the VCO; producing, in a digitally adjustable frequency divider coupled to an output of the VCO, a reduced frequency signal from the synthesized frequency signal; producing, in a phase digital-to-analog converter (DAC) receiving a timing signal and a digital control signal, a delayed version of the timing signal that is delayed according to the digital control signal; producing, in a phase detector (PD) coupled to outputs of the digitally adjustable frequency divider, of the phase DAC, and of a reference clock, a phase control signal and coupling the phase control signal to the input of the VCO; and controlling, by a digital signal converter receiving a digital signal, the digitally adjustable frequency divider and the phase DAC so as to cause a phase or frequency of the synthesized frequency signal output by the VCO to track a desired phase or frequency trajectory encoded in a digital signal received by the digital signal converter.

According to various aspects of the disclosure, the output of the VCO of the frequency synthesizer can be coupled to a power amplifier of a transmitter, or to a mixer in a radio receiver to provide a reference for frequency conversion of a received RF signal. In some embodiments, the mixer is coupled to the VCO through one or more buffers which may be analog (e.g., class A amplifier) or digital (e.g., one or more inverters coupled in series).

The method may further include determining, in the digital signal converter, whether a delay threshold is reached by the phase DAC, and adjusting a frequency division of the digitally adjustable frequency divider in response to determining that the delay threshold is reached by the phase DAC. In one example, the adjusting includes, when a maximum delay threshold is reached by the phase DAC, reducing the digitally adjustable delay of the phase DAC and increasing the frequency division of the digitally adjustable frequency divider. When the maximum delay threshold is reached by the phase DAC, the digitally adjustable delay of the phase DAC may in some embodiments be reduced by a length of time equal to one period of the synthesized frequency signal. The adjusting may further include, when a minimum delay threshold is reached by the phase DAC, increasing the digitally adjustable delay of the phase DAC and decreasing the frequency division of the digitally adjustable frequency divider.

The timing signal received by the phase DAC may be the reduced frequency signal produced by the digitally adjustable frequency divider, and the method may further include outputting to the PD a delayed version of the reduced frequency signal.

The timing signal received by the phase DAC may be a reference clock signal from the reference clock, and the method may further include outputting directly to the PD a delayed version of the reference clock signal.

The method may further include filtering the phase control signal produced by the PD, and providing the filtered phase control signal to the input of the VCO.

The controlling of the phase DAC may include controlling the phase DAC based on a value stored in a digital accumulator receiving the digital signal, and the controlling of the digitally adjustable frequency divider may include controlling the digitally adjustable frequency divider based on an overflow or an underflow condition of the accumulator reaching an upper limit or a lower limit of a predetermined range of the accumulator.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various methods and circuits disclosed herein relate to providing transmitter architectures that use arbitrary phase trajectory controllers to directly generate phase modulated radio-frequency (RF) signals.

The transmitter architectures provide arbitrary phase trajectories by combining a high resolution phase digital-to-analog converter (DAC) with a fast phase-locked loop (PLL). The approach reduces power consumption, design complexity, and die area by eliminating the need for multipliers, orthogonal signal summing, filtering before a power amplifier (PA), and provides for the use of inductorless oscillators. The arbitrary phase trajectory approach can generate signals ranging from IEEE 802.15.4 quadrature phase shift keying (QPSK) to Bluetooth gaussian frequency-shift keying (GFSK) with arbitrary channel center frequencies.

In some embodiments the methods and circuits are combined with an amplitude modulator to effect a polar modulator thereby enabling arbitrary placement of a transmitted signal vector on a constellation diagram allowing arbitrary modulation format.

The transmitter architectures and associated signal modulation architectures reduce modulator current by 50% below currents drawn by standard transmitter circuits and devices, reduce transmitter die area by more than 50%, support chip rates of 4 Mchips/sec to 8 Mchips/sec, provide phase trajectory shaping to reduce channel bandwidth, and support GFSK for compatibility with Bluetooth Classic, Bluetooth Low Energy, and ANT protocols. Further, in contrast to traditional transmitter designs which typically up-convert two orthogonal I and Q signals, the signal modulation architectures disclosed herein directly create an arbitrary phase trajectory without the use of orthogonal I and Q signals.

Reference now is made in detail to the examples illustrated in the accompanying drawings and discussed below.

Figure 1:
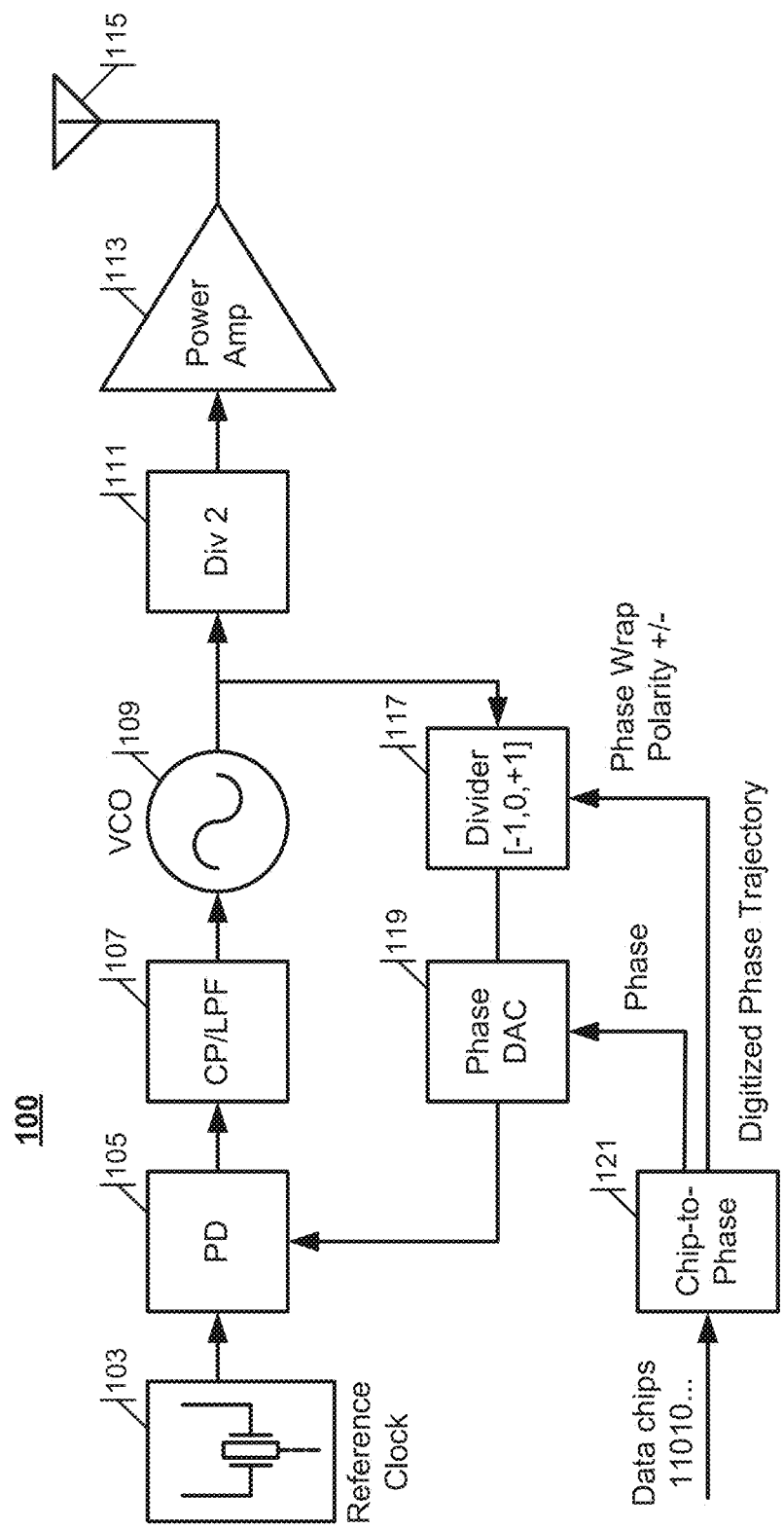
FIGS. 1-6 are functional block diagrams showing illustrative architectures of transmitters that directly generate phase modulated radio-frequency (RF) signals.

FIG. 1 illustrates the basic architecture of a transmitter 100 that directly generates phase modulated radio-frequency (RF) signals. The transmitter 100 includes a voltage controlled oscillator (VCO) 109 that generates an RF signal that drives the power amplifier (PA) 113. In transmitter 100, the VCO 109 operates at twice the RF channel frequency (e.g., twice the frequency of the RF signal to be output by the PA 113). For example, the VCO 109 may operate at 5 GHz, while the signal output by the PA 113 is a 2.5 GHz signal. Hence, in transmitter 100, a frequency divider 111 is coupled between the output of the VCO 109 and the input of the PA 113 in order to divide the frequency of the VCO output signal by two before providing the signal to the PA. The use of the series connection of the VCO 109 having a higher frequency and of the frequency divider 111 enables the transmitter 100 to output an RF signal having a 50% duty cycle. The use of a VCO 109 having a higher frequency and of the frequency divider 111 is optional, and the output of the VCO 109 may alternatively be provided directly to the PA 113.

The PA 113 amplifies and/or isolates the RF signal received from the VCO 109 (e.g., received either directly from the VCO 109, or via the frequency divider 111). The PA 113 thereby provides power gain to output a full-power RF signal through the antenna 115, and provides impedance matching to effectively couple the signal to the antenna 115 and minimize loading caused by the antenna 115 on the VCO 109.

For constant envelope signals such as IEEE 802.15.4 signals (e.g., offset QPSK (OQPSK) signals with half-sine pulse shaping) and Bluetooth (GFSK) signals, the RF signals output by the PA 113 and antenna 115 have constant amplitude envelopes. In such signals, all modulation information is encompassed and encoded in the phase of the output RF signal. The VCO 109 is used to directly modulate the phase of the RF signal relative to the channel center frequency, and the VCO may therefore be required to provide precise phase modulation. The transmitter 100 may therefore be designed to provide precise control of the VCO 109 to output a predetermined and exact phase trajectory over time.

The frequency and phase of a VCO may be controlled using a phase locked loop (PLL). In transmitter 100, a modified PLL having a fast update rate and providing arbitrary phase control is used. The PLL uses the RF signal output by the VCO 109 to produce the VCO input signal and thereby control the operation of the VCO 109 including the output frequency of the VCO 109. Specifically, the high frequency RF signal output from the VCO 109 is divided down to a lower rate by an integer frequency divider 117. For example, a 5 GHz signal may be divided down to a 40 MHz signal by the frequency divider 117 (e.g., when the frequency divider 117 is set to operate with a frequency ratio of 125-to-one). The frequency divider 117 is digitally adjustable and has the specialized ability to add or subtract counts of the 5 GHz signal each period. In general, a conventional fractional-N frequency divider provides two divider ratios: N and N+1. In contrast, in transmitter 100, the frequency divider 117 provides three divider ratios: N−1, N, and N+1. As such, if the frequency divider 117 is set to operate with a frequency ratio of 125-to-one, the frequency divider 117 can be selectively controlled to operate with a frequency ratio of 126-to-one, of 124-to-one, or to maintain and hold steady with the 125-to-one ratio. Allowing counts to be either added or subtracted from the nominal value by the frequency divider 117, as well as simply counting to the nominal value by the frequency divider 117, provides an elegant way to handle the limited dynamic range of the phase-DAC.

In the PLL, the divided down signal output by frequency divider 117 enters a phase digital-to-analog converter (DAC) 119 which delays the signal based on a digital input signal. The phase DAC 119 may function as a digitally adjustable delay that delays a timing signal received at its input by a delay amount selected according to the digital control signal, and outputs the delayed signal. In one example, the phase DAC 119 has a full scale range of 360 degrees with respect to the VCO frequency such that the phase DAC 119 can delay the input signal by up to one period of the VCO frequency. The phase DAC 119 may have a 2 degree resolution, such that one period of the VCO frequency is divided in 360 degrees with 2 degree resolution. In the one example, for a 5 GHz RF signal output by the VCO 109, the phase DAC 119 may thus include 180 digitally controlled delay cells which jointly provide up to 200 pico-seconds (ps) delay full-scale (i.e., one period of the 5 GHz signal) and each provide 200/(360/2)=1.1 ps resolution (slightly less than 8-bits). The resolution of the phase DAC 119 may be set by error vector magnitude (EVM) specifications, spectral mask requirements, and PLL filtering bandwidth. Because the phase DAC 119 operates on the signal output by the divider 117 having the divided-down frequency, the phase DAC 119 need only operate at the divided-down frequency (e.g., at 40 MHz in our example). As such, the phase DAC 119 has time between edges of the divided-down frequency signal (e.g., approximately 25 ns in the case of a 40 MHz signal) to change digital settings of the delay elements of the phase DAC 119 between rising (or falling) edges of the divided-down frequency signal. Because the edge transition rate is less than a hundredth of the edge transition rate of the original RF signal in our example, the inclusion of the phase DAC 119 at this location in the PLL feedback loop results in a negligible increase in power consumption because the phase DAC 119 is operating at a comparatively low rate (as compared to the rate/frequency of the RF signal output by the VCO 109 or transmitter 100).

The signal output by the phase DAC 119 is used to control the VCO 109 through the PLL feedback loop. Specifically, the delayed signal output by the phase DAC 119 (i.e., the divided down and phase adjusted signal) is provided to an input of a phase detector (PD) 105 or a phase-frequency detector (PFD). The PD 105 (or PFD) receives at its other input a reference clock signal, e.g., a signal derived from a reference clock 103 or quartz crystal having low phase noise and high frequency accuracy. The phase error signal output by the PD 105 is calculated based on a difference between the signals received by the PD 105, and is provided to the charge pump (CP) 107. The CP 107 provides low pass filtering (LPF) of the phase error signal, and provides the control signal the VCO 109 coupled to its output.

In the transmitter 100 of FIG. 1, the PD 105, CP/LPF 107, VCO 109, frequency divider 117, and phase DAC 119 form part of a frequency synthesizer that outputs a radio frequency signal having a desired phase trajectory from the output of the VCO 109. The frequency synthesizer can be used in a transmitter 100, as shown in FIG. 1, or in other circuits or devices such as receivers, sampling and clock circuits, or the like.

The frequency of the reference clock signal (output by reference clock 103) sets the sampling period for the PLL.

Running the reference clock (and, consequently, the PLL loop) at a high frequency (e.g., 40 MHz) allows for a closed-loop PLL bandwidth on the order of 4 MHz or more. A fast PLL bandwidth allows chip modulation rates of 2-4 MHz (e.g., the signal bandwidth may be about 1-2 MHz) and even up to 8 MHz (e.g., with a signal bandwidth of about 4 MHz). When the desired phase trajectory bandwidth approaches the PLL bandwidth, the inherent PLL filtering will tend to filter the desired phase trajectory. To compensate for this effect, pre-emphasis of the desired phase trajectory to cancel the effect of the limited, but knowable, PLL bandwidth may be used. In some examples, phase trajectory transitions may also be advanced in time to compensate for PLL delay (e.g., group delay). Alternatively, feed-forward control to directly control the VCO can be added to compensate for PLL low pass filtering. An additional advantage of a fast PLL sample rate is the ability to vastly reduce phase noise which may be particularly helpful for a VCO realized using no inductors (e.g., a ring-oscillator VCO) since VCO phase noise within the PLL bandwidth is attenuated.

The output of the PD 105 is a set of digital control lines for controlling operation of the CP 107. The output of the CP is low pass filtered (LPF) before being applied to the VCO 109. In some embodiments a filter is incorporated as an integral part of the CP. The filter may include an integrator term to filter out DC phase error. The filter may also have either a lead/lag network or a proportional feedback term for stability. The bandwidth of the PLL sets the bandwidth of the phase trajectory tracking loop. A slow response (i.e. low PLL bandwidth) will provide poor phase tracking, while a very fast response (i.e. high PLL bandwidth) will insufficiently filter phase DAC quantization error, reference clock spurs, and charge pump glitches. Coarse frequency-range calibration may be used to set the VCO frequency close to the channel center frequency (e.g., the frequency of the signal output by the VCO) so the VCO in the PLL does not require an excessive tuning range.

In order to accurately control the phase of the VCO 109, the transmitter 100 includes both a frequency divider 117 and a phase DAC 119 in the feedback back loop controlling operation of the PLL 109. The phase DAC 119, however, is subject to phase wrapping: if the phase needed in the RF output signal exceeds the full range of the phase DAC (e.g., exceeds 360 degrees of phase, which may correspond to one period of the VCO output signal, an 8-bit range, and/or the 200 ps range in the illustrative example detailed above), the phase DAC 119 may reach the end of its range (and, in some examples, may overflow). However, in order to modulate the RF signal output by the VCO 109, more than 360 degrees of phase may be needed. For example, to modulate a digital signal having repeated 1s or 0s in a sequence (e.g., in minimum-shift keying (MSK)), the ability to add more than 360 degrees of phase to the signal may be needed.

To address phase wrapping, the transmitter 100 includes chip-to-phase converter 121, synchronously controlling the operation of both the frequency divider 117 and phase DAC 119. The chip-to-phase converter 121 receives a data signal (e.g., a sequence of digital bits), and controls the frequency divider 117 and phase DAC 119 to encode the information contained in the data signal into the phase of the RF signal. In some embodiments, the chip-to-phase converter includes a clock input, which may receive a signal generated from the reference clock 103 or from the output of the VCO 109 to provide a synchronous signal for controlling the frequency divider 117 and the phase DAC 119. In this regard, the chip-to-phase converter 121 makes use of the three divider ratios (N−1, N, and N+1) of the frequency divider 117 to address phase wrapping as detailed below.

In general, chip-to-phase converter 121 functions as a digital signal converter to provide to the phase DAC 119 a phase control signal that encodes the information contained in the received digital signal. In turn, the phase DAC 119 digitally controls the delay/phase introduced by the phase DAC 119 into the divided-down signal based on the received phase control signal. Additionally, the chip-to-phase converter 121 monitors the phase control signal to determine whether the phase extends to or exceeds the full range of the phase DAC 119 (e.g., extends to or exceeds 360 degrees of phase in the one example). If the chip-to-phase converter 121 determines that the phase control signal has reached or exceeded the full-range of phase (e.g., the phase control signal has reached an upper/maximum threshold limit or a lower/minimum threshold limit of the full-range of phase/delay that can be provided by the phase DAC 119), the converter 121 adjusts both the phase DAC 119 and the frequency divider 117. The chip-to-phase converter 121 thereby controls the phase of the RF signal output by the VCO 119 to encode the received digital signal into the phase of the RF signal by adjusting the phase and count of the phase DAC 119 and frequency divider 117.

If the phase extends to the full-range of phase/delay that can be introduced by the phase DAC (e.g., 360 degrees of phase) and additional phase/delay is needed, the converter 121 adds one count (N+1) to the frequency divider 117 and subtracts one period of phase from the phase signal provided to the phase DAC 119 (or otherwise controls the phase DAC 119 to reduce the phase/delay introduced by the phase DAC by one period of the VCO output signal). By adding one count to the frequency divider 117, the signal output by the frequency divider 117 becomes slower by having its period extended by one period of the VCO output signal (e.g., the frequency of the RF signal output by the VCO 109 is divided by 126 instead of 125, resulting in the frequency-divided signal having a period of 25.2 ns instead of a period of 25 ns). Further, by reducing the phase/delay introduced by the phase DAC by one period of the VCO output signal (e.g., 200 ps), the effect of adding the one count to the frequency divider 117 is neutralized or zeroed out while the full-range of phase/delay that can be provided by the phase DAC 119 is restored.

Conversely, if the phase extends below 0 degrees (e.g., less phase is needed), the converter 121 decrements or subtracts one count (N−1) from the frequency divider 117 and adds one period of phase to the phase signal provided to the DAC 119 (or otherwise controls the phase DAC 119 to increase the phase/delay introduced by the phase DAC by one period of the VCO output signal). By subtracting one count to the frequency divider 117, the signal output by the frequency divider 117 becomes faster by having its period reduced by one period of the VCO output signal (e.g., the frequency of the RF signal output by the VCO 109 is divided by 124 instead of 125, resulting in the frequency-divided signal having a period of 24.8 ns instead of a period of 25 ns). Further, by increasing the phase/delay introduced by the phase DAC by one period of the VCO output signal (e.g., 200 ps), the effect of subtracting the one count to the frequency divider 117 is neutralized or zeroed out while the full-range of phase/delay that can be provided by the phase DAC 119 is restored.

In various embodiments the control and coordination by the chip-to-phase converter 121 of the phase DAC 119 and the frequency divider 117 is such that the addition or subtraction of a count from the frequency divider 117 is chosen so the threshold for adjusting the frequency divider 117 is at or towards the maximum or minimum output value of the phase DAC 119; counts are added or subtracted as appropriate at a threshold value near the center of the phase DAC's range; the threshold occurs at a constant phase DAC value from period to period; the threshold occurs at a varying but known phase DAC value from period to period (e.g., as part of a dynamic element matching scheme); the phase DAC has more than 360 degrees (e.g., 720 degrees); and/or more than one pulse is added or subtracted in response to crossing a threshold. In an example of a dynamic element matching scheme, the phase DAC may have a range of 540 degrees and the threshold for frequency divider count adjustment is dithered between 360 and 540 degrees.

Hence, if phase extends beyond full scale 360 degrees, the converter 121, phase DAC 119, and frequency divider 117 operate such that one count is added to the frequency divider 117 and the remainder of (phase−360°) can be used for further phase adjustments by the phase DAC 119. Conversely, a negative phase (below zero degrees) can be realized by subtracting a count from the frequency divider 117 and resetting the phase DAC value (phase+360°). The converter 121, phase DAC 119, and frequency divider 117 thereby allow the VCO 109 to seamlessly track arbitrary phase trajectories. In general, the addition and subtraction of counts (+/−1 count) in the frequency divider 117 only occurs during the phase wrap transition because phase is the integral of frequency: the phase remains affected in subsequent cycles by adjustments to the count in previous cycles.

The chip-to-phase converter 121 converts data chips of the digital signal into a phase trajectory. In some embodiments the phase trajectory calculations are performed in a distinct block, the output of which is coupled to 121 which in this case is only responsible for controlling the frequency divider 117 and the phase DAC 119 to cause the phase to track the digital input signal received by the chip-to-phase converter 121. For simple modulation types, each chip can be mapped to a sequence of phase DAC settings. For example, OQPSK or FSK signals could be mapped to an increasing phase ramp for logic state "1" and a decreasing ramp for logic state "0". More complicated modulation (e.g., Bluetooth GFSK) or reduced channel bandwidth OQPSK may have phase modulation that includes state history of the chipping: e.g., phase trajectories that are based on chip pairs such as 00, 01, 10, and 11. In other cases, the trajectory may not be piecewise, but may instead be a filtered trajectory derived from digital processing (e.g., a digitally filtered trajectory).

The transmitter 100 and converter 121 are not limited to any particular encoding of the data chips into the phase trajectory, and encoding with modulation formats other than those described herein can also be used. The conversion of digital data to equivalent phase is preferably done at high rates for faster modulation schemes. Another approach to generating the phase trajectory can involve having a slow sample rate for phase points stored in memory, and then a fast hardware interpolator which linearly generates fast samples for the control loop.

The above description of the transmitter 100 has focused on an example in which the center frequency is an integer multiple of the reference frequency. Therefore, the VCO signal is divided by an integer by frequency divider 117. In some transmitters 100, however, the RF signal may need to be divided by a non-integer or fractional number. In such cases, non-integer or fractional PLL divider values can be used. By way of example, a double frequency (e.g., running at 2× the channel center frequency) IEEE 802.15.4 VCO requires (2.405 GHz*2)/40 MHz=120.25 clock division. To provide this clock division, chip-to-phase converter 121 can control the frequency divider 117 to divide the RF signal frequency by 120 and control the phase DAC 119 to increase the delay by 1/4 period (or 90 degrees) at each divided-down signal edge (received from frequency divider 117). Thus, by using a phase DAC 119 that is adjustable in steps between 0 and 360 degrees, center frequencies needed for IEEE 802.15.4 and Bluetooth can be achieved by implementing fractional frequency division using converter 121, phase DAC 119, and frequency divider 117. More generally, nearly arbitrary channel center frequencies can be achieved using such a partial count method (e.g., counts of 1/8, 1/9, 1/55). Dithering of the divider ratio may be used to attain even finer channel spacing resolution.

The transmitter 100 shown in FIG. 1 is one example of a transmitter that incorporates arbitrary phase control. Further examples of such transmitters are presented in relation to FIGS. 2-4.

Figure 2:
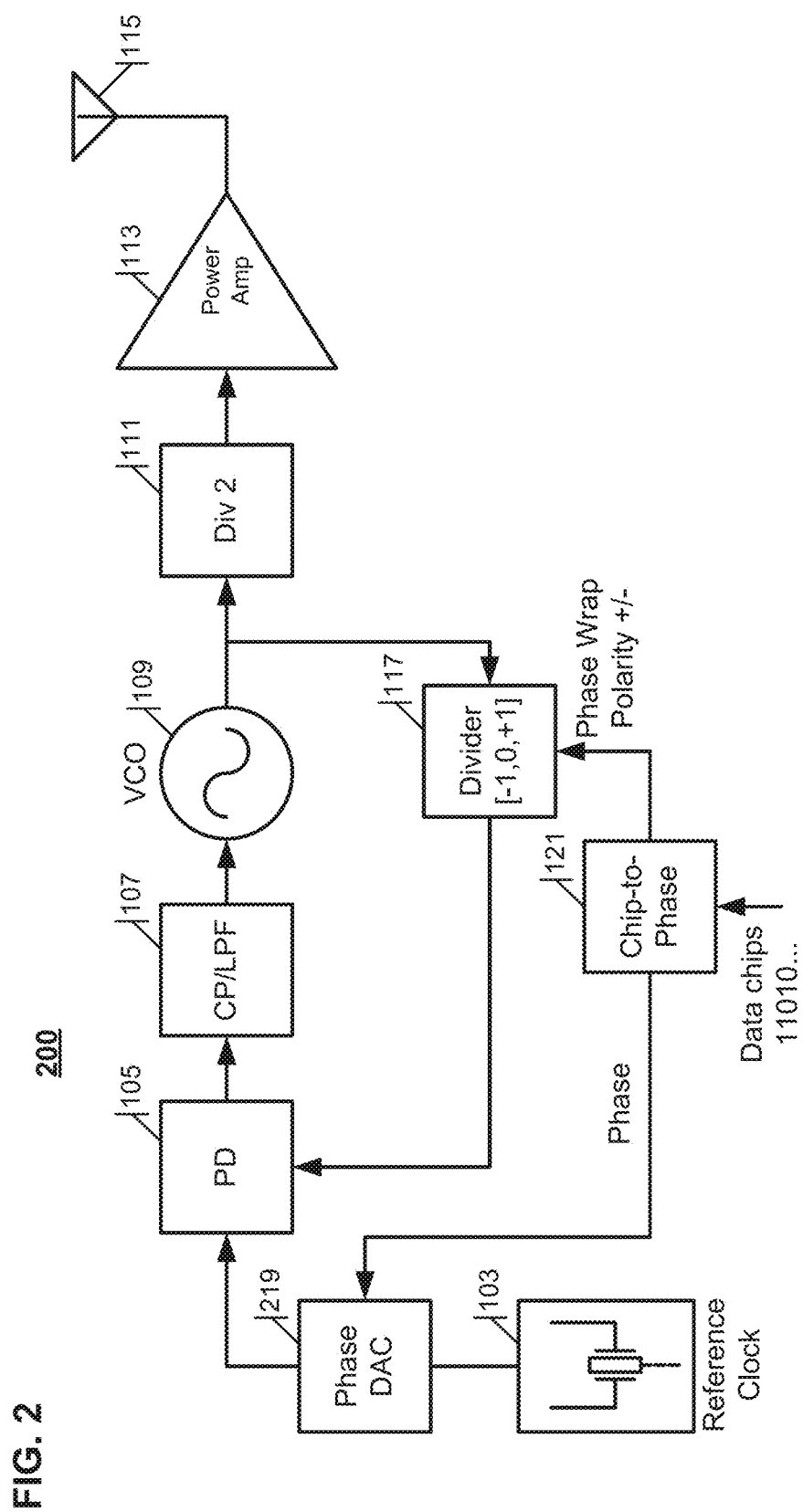

FIG. 2 shows an alternative transmitter architecture for providing arbitrary phase control. The transmitter 200 of FIG. 2 is substantially similar to the transmitter 100 of FIG. 1 except for the position of the phase DAC 219 within the transmitter. While the phase DAC 119 of transmitter 100 is located in the PLL feedback path between the frequency divider 117 and the PD 105, the phase DAC 219 of transmitter 200 is coupled in the path between the reference clock 103 and the PD 105—such that the reference clock signal output by the clock 103 is delayed by the phase DAC 219, and the delayed clock signal is provided to the PD 105. The phase DAC 219 functions substantially similarly to the phase DAC 119 of transmitter 100, and is controlled in concert with frequency divider 117 in the manner described above. Further, the remaining components of transmitter 200 function substantially similarly to the corresponding components of transmitter 100, and reference can be made to the description of transmitter 100 for further details.

Figure 3:
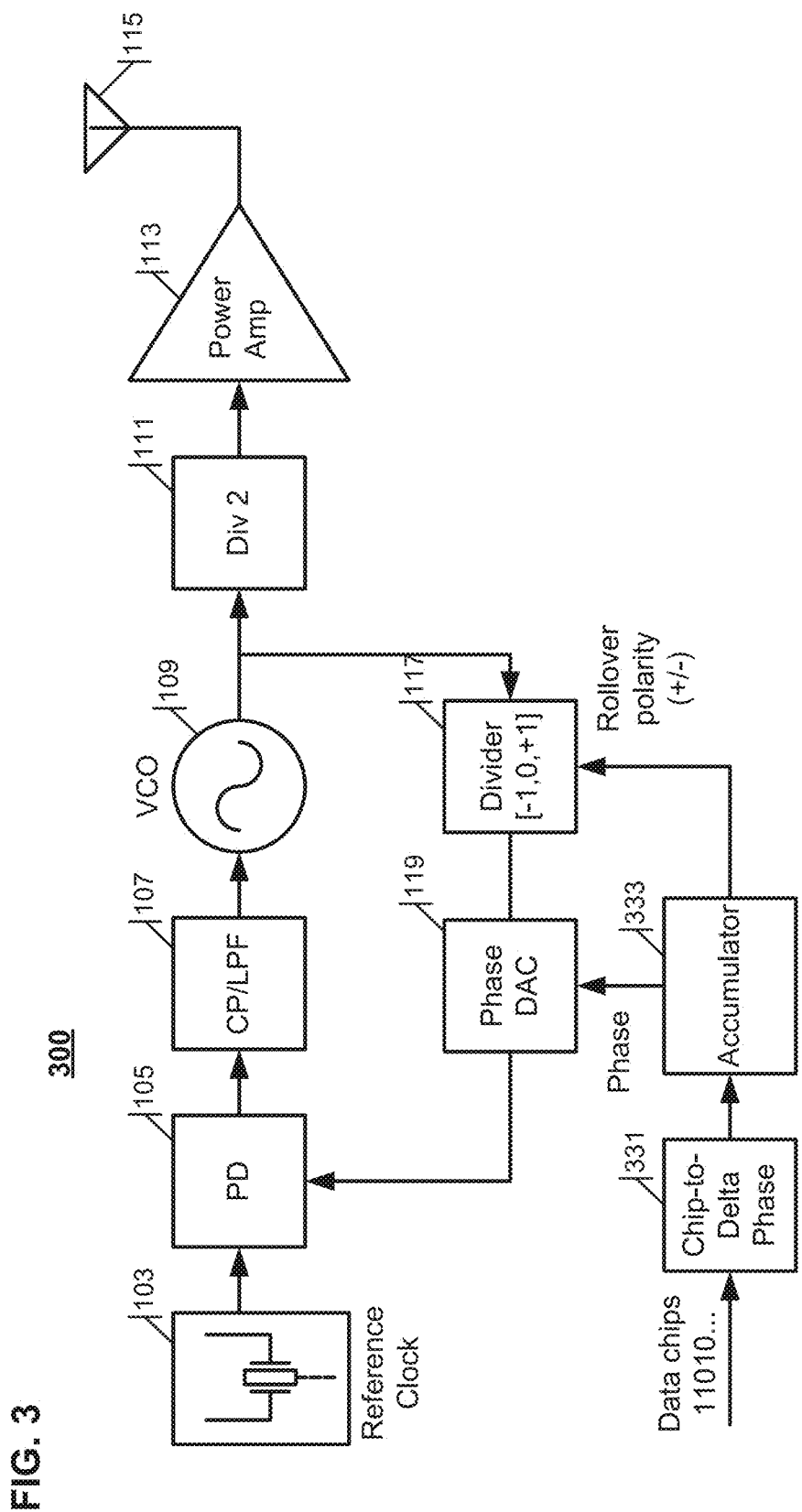

FIG. 3 shows a further transmitter architecture for providing arbitrary phase control. The transmitter 300 of FIG. 3 is substantially similar to the transmitter 100 of FIG. 1 with the exception of the chip-to-delta phase converter 331 and the digital accumulator 333 that replace the chip-to-phase converter 121 of transmitter 100. The chip-to-delta phase converter 331 converts the digital signal to a signal indicative of the change in phase (e.g., an increase in phase, or a decrease in phase) or change in signal period (e.g., an increase in the signal period, or a decrease in the signal period) that is needed to encode the digital signal in the RF signal. The chip-to-delta phase converter 331 thus produces a phase delta signal (e.g., a signal indicative of a required change in angle/phase or delay) for each reference-clock sample rather than producing a signal indicative of absolute phase. In some embodiments the chip-to-delta phase converter 331 includes a differentiator that operates on a desired phase.

The digital accumulator 333 receives the change-in-phase information from the converter 331 (i.e., the information contained in the phase delta signal), and accumulates the change-in-phase information. The accumulator 333 is a finite-width, signed adder and provides the necessary phase wrapping. Specifically, the accumulator 333 is set to have a predetermined accumulator register capacity or threshold that is equal to or less than the maximum range of the phase DAC 119. The accumulator register value is provided to the phase DAC 119 and indicates the amount of phase that should be provided by the phase DAC 119. Further, the accumulator 333 outputs a signed overflow signal that is provided to the frequency divider 117. As such, when the phase exceeds the accumulator's capacity (e.g., an accumulator overflow), the accumulator's signed overflow signal causes the frequency divider 117 to increment by one (+1). On the other hand, when the phase falls below the accumulator's minimum (zero) (underflow), the signed overflow signal of the accumulator 333 will cause the frequency divider 117 to decrement by one (−1). In all cases, the accumulator's current count (stored in the accumulator register) is provided to the phase DAC 119 to control the signal delay imposed by the phase DAC 119. The accumulator's current count is automatically adjusted in response to an overflow or an underflow by subtracting or adding one period of phase by controlling the frequency divider 117 to increment or decrement by one.

Thus, by setting the accumulator 333 rollover threshold to correspond to the maximum phase value of the phase DAC 119 being reached, phase wrapping (including repeated phase wrapping) is seamlessly handled. The rollover threshold of the accumulator 333 may be the binary maximum (e.g., 255 for 8-bits) or may be set to a lower value (e.g., 180, 200, or 250). Using a lower maximum phase DAC value than the actual full scale of the phase DAC provides additional digital tuning range for temperature and process drift. Additionally, the phase DAC may have a tuning range larger than 360 degrees (e.g., 540 degrees) and the accumulator threshold may be dithered (e.g., 360 to 540 degrees) to provide dynamic element matching.

Figure 4:
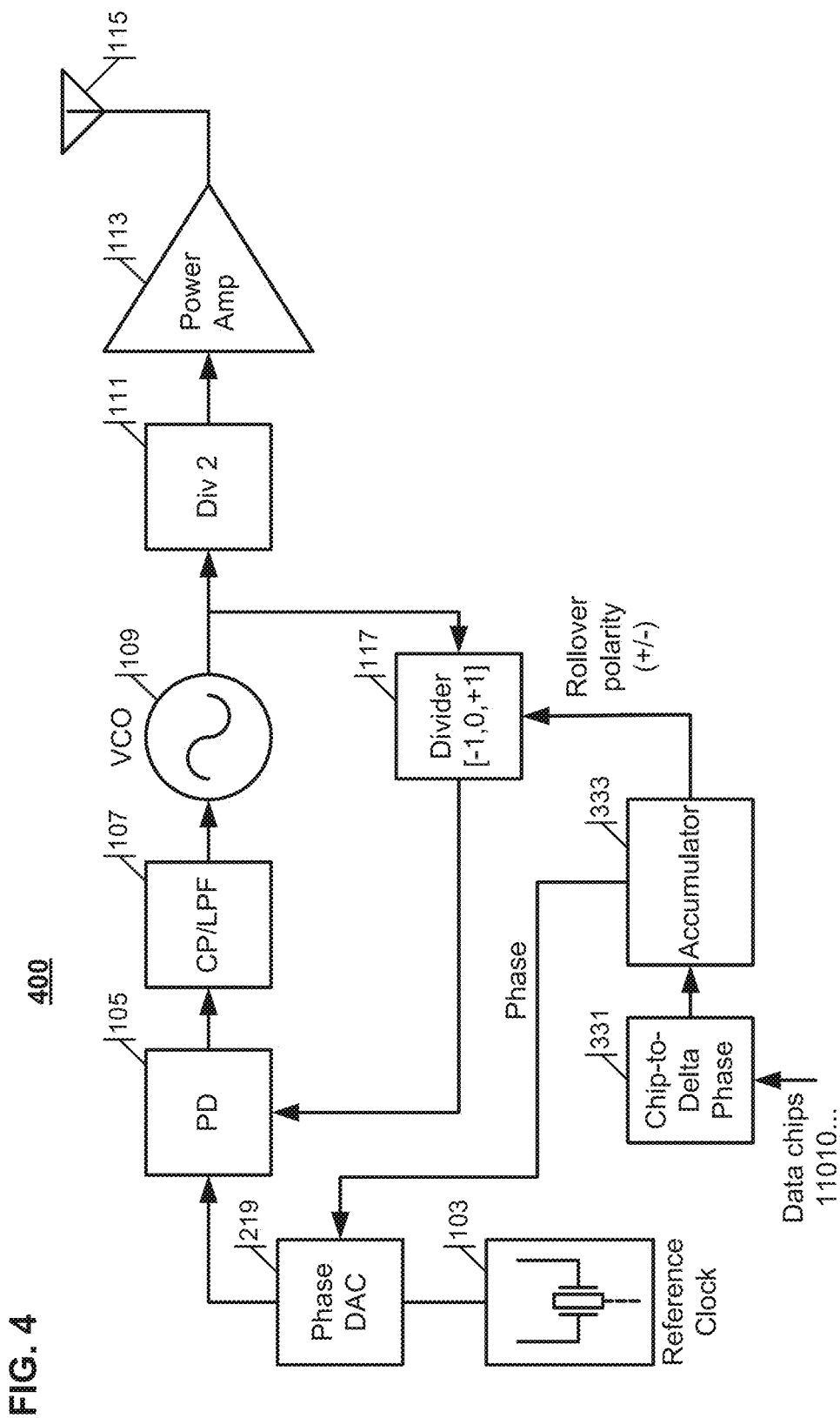

FIG. 4 shows another transmitter architecture for providing arbitrary phase control. The transmitter 400 of FIG. 4 is substantially similar to the transmitter 100 of FIG. 1, and implements both of the changes described above in relation to transmitter 200 and transmitter 300. As such, in transmitter 400, the phase DAC 219 is connected in the path between the reference clock 103 and the PD 105. Further, the chip-to-phase converter 121 of transmitter 100 is replaced with the chip-to-delta phase converter 331 and the accumulator 333 described in relation to transmitter 300 above. The accumulator 333 controls operation of the frequency divider 117 and the phase DAC 219.

Figure 5:
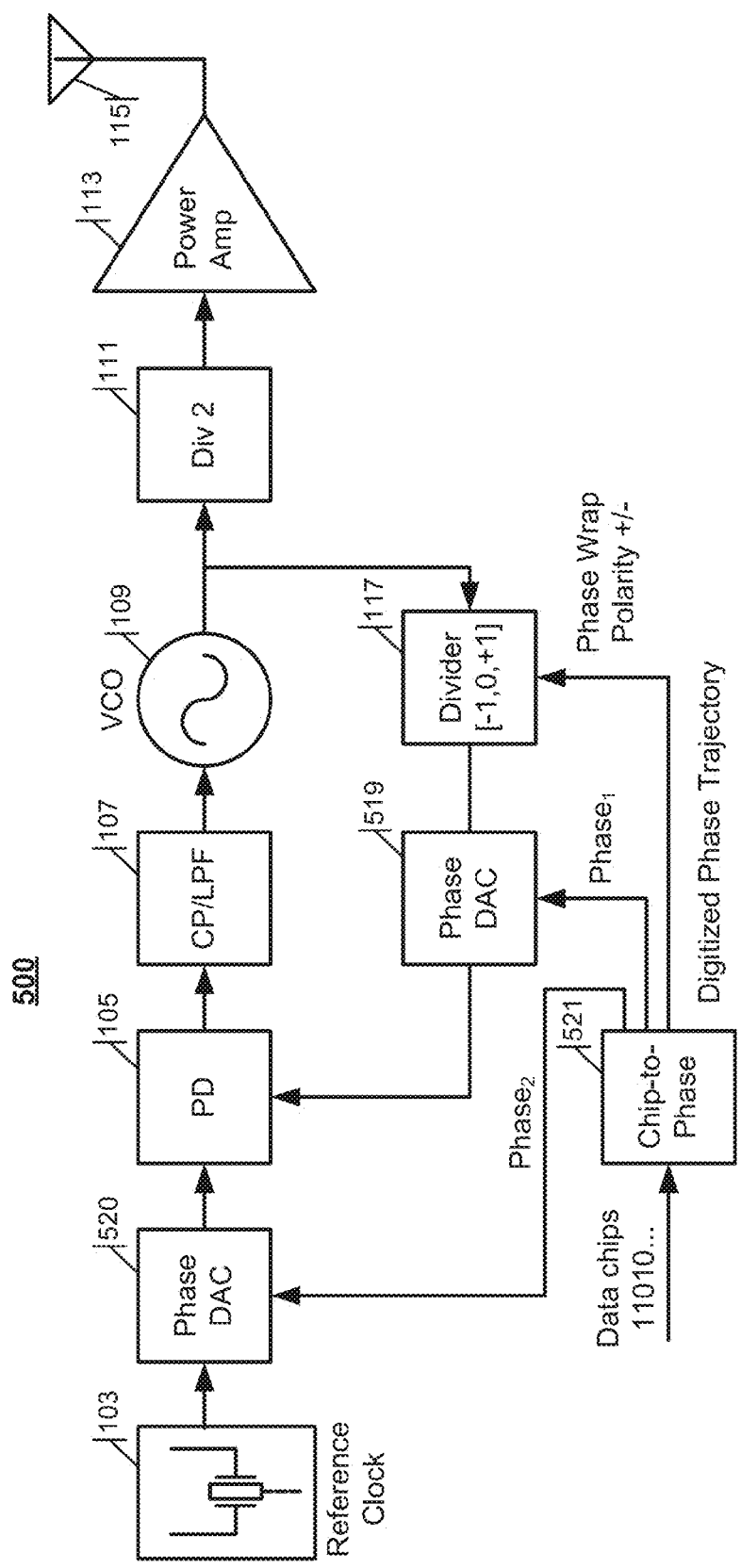

FIG. 5 shows a further transmitter architecture for providing arbitrary phase control. The transmitter 500 of FIG. 5 is substantially similar to the transmitter 100 of FIG. 1, but includes two separate phase DACs: a first phase DAC 519 coupled in the feedback loop (similarly to phase DAC 119 of transmitter 100), and a second phase DAC 520 coupled in the reference path (similarly to phase DAC 219 of transmitter 200). By including two separate phase DACs, transmitter 200 can more effectively cancel even-order nonlinearity occurring in the transmitter. In transmitter 500, the total phase shift from the first and second phase DACs 519 and 520 is equal to the difference between the phases inserted by each phase DAC independently. The chip-to-phase converter 521 outputs two separate phase signals $Phase_1$ and $Phase_2$ to separately control the phase introduced by each phase DAC 519 and 520.

In some embodiments, an additional control signal is used to switch the connectivity of the inputs and the outputs of phase DAC 519 and phase DAC 520 so that the errors are effectively chopper-stabilized out, or to attain a dynamic element matching effect.

Figure 6:
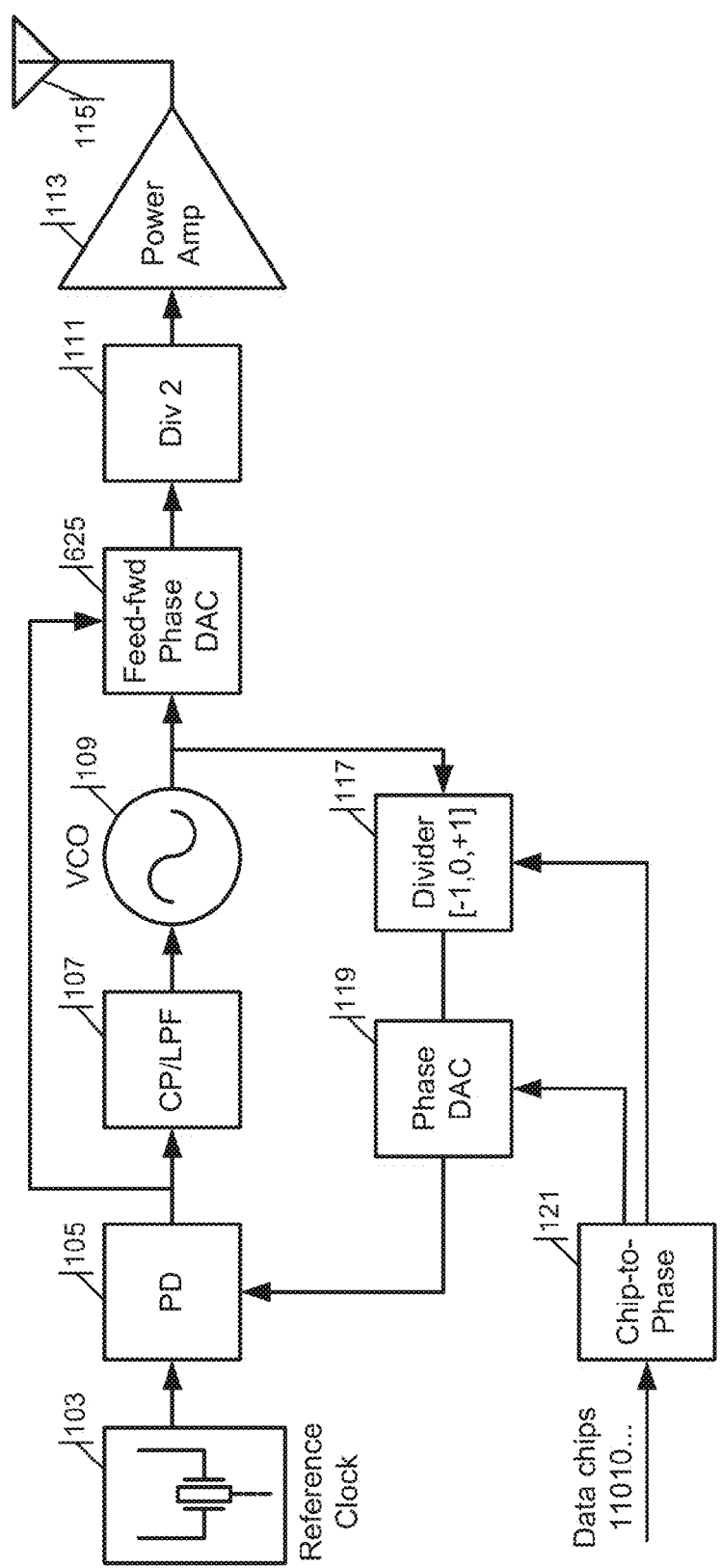

FIG. 6 shows a transmitter 600 that is substantially similar to the transmitter 100 of FIG. 1, and additionally includes a feed-forward phase DAC 625 connected between the output of the VCO 109 and the input of the frequency divider 111 (and/or between the output of the VCO 109 and the input of the power amplifier 113 in embodiments in which the optional frequency divider 111 is not used). The feed-forward phase DAC 625 receives at its input the signal output by the PD 105, and adjusts the phase of the RF signal output by the VCO 109 based on the signal at its input. The feed-forward phase DAC 625 is connected outside of the PLL loop and thereby provides a feed-forward path for adjusting the phase of the RF signal output by the VCO 109 prior to amplification by PA 113. The feed-forward path can be used to attenuate phase noise and phase trajectory tracking error at high frequencies. For example, the error signal output by the PD 105 is fed forward to the calibrated feed-forward phase DAC 625. This feed-forward loop may attain a bandwidth substantially higher than the PLL bandwidth because it is outside the feedback loop and therefore increasing the feedforward bandwidth does not cause instability in the PLL. The feed-forward phase DAC 625 can have a small range (e.g. smaller than the range of phase DAC 119) because it is only used for fine tuning of the error.

Figure 7:
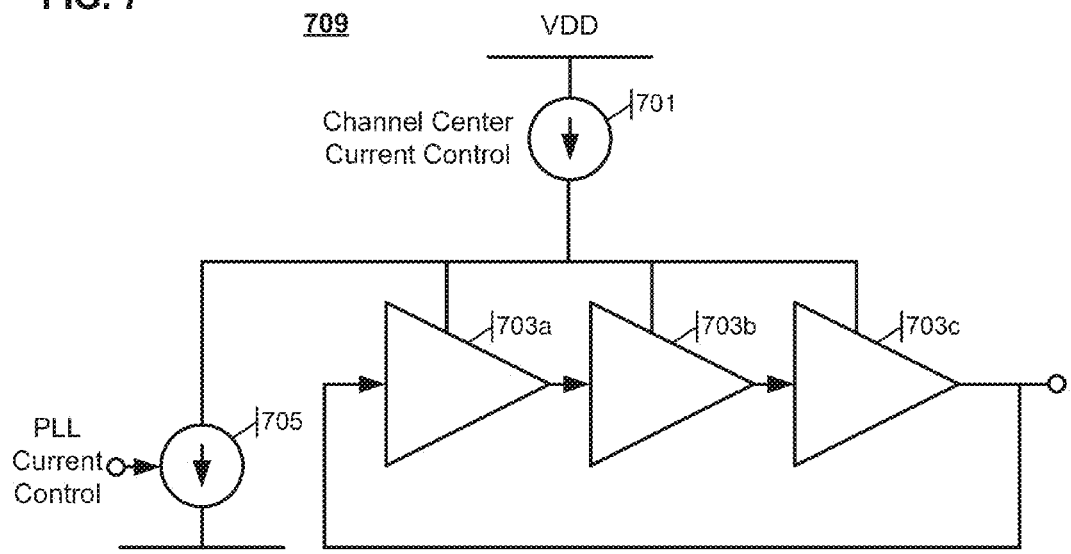
FIG. 7 is a functional block diagram showing an illustrative architecture of a voltage controlled oscillator (VCO) as may be used in the transmitter of any one of FIGS. 1-6.
Figure 8:
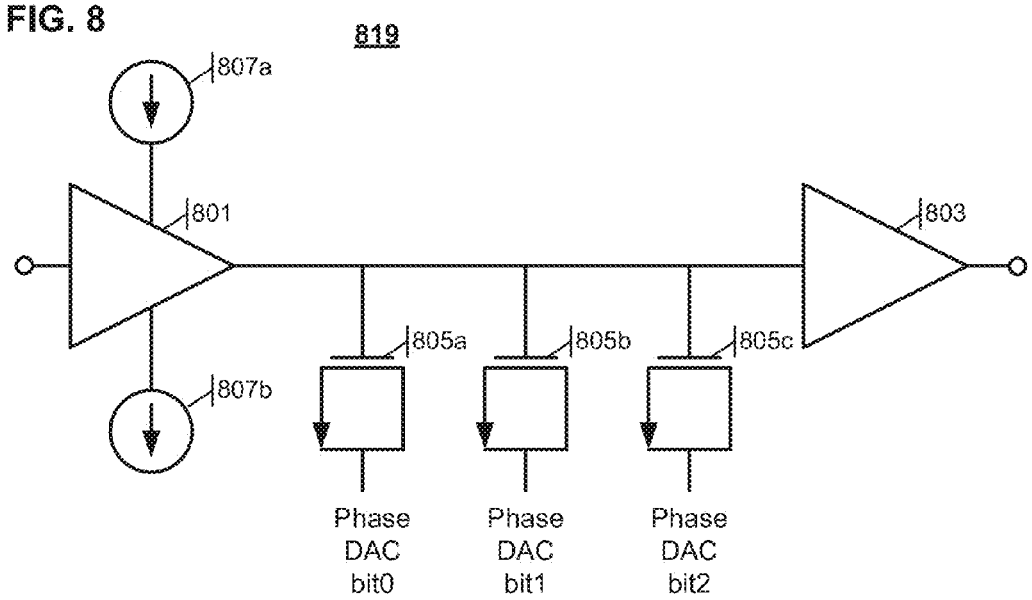
FIGS. 8 and 9 are functional block diagrams showing illustrative architectures of phase digital-to-analog converters (DACs) as may be used in the transmitter of any one of FIGS. 1-6.

FIGS. 7 and 8 show detailed views of illustrative circuit architectures for use in the VCOs 109 and phase DACs (e.g., phase DAC 119, 219, 519, 520, and/or 625) of transmitters 100-600. Both the VCOs and the phase DACs can be realized using many different architectures including the architectures shown in FIGS. 7 and 8 and architectures different from those shown in FIGS. 7 and 8.

As shown in FIG. 7, VCO 709 includes a first current source 701 providing a supply current to a ring oscillator including a plurality of inverters 703a-c coupled in series in a closed loop. In the example shown in FIG. 7, three inverters 703a-c are coupled in series; in other examples, five or more inverters can be coupled in series to form the ring oscillator. In some embodiments a differential inverting circuit is used in place of single-ended inverters; in other embodiments, an even number of stages are used. The signal at the output of one of the inverters (e.g., 703c) is used as the output signal of the VCO 709. The VCO 709 further includes a second current source 705 coupled in series with the first current source 701. The second current source 705 draws an adjustably variable current, the current drawn by the second current source 705 being adjustably determined based on a current control signal received by the second current source 705. In each of the transmitter circuits 100-600 shown in FIGS. 1-6, the current drawn by the second current source 705 is adjustably determined based on a current control signal received at the input node of the VCO 109. The second current source 705 is coupled in series with the first current source 701 and draws a portion of the current output by the first current source 701. The remaining current output by the first current source 701, i.e., the current output by the first current source 701 that is not drawn by the second current source 705, is provided to supply the inverters 703a-c. Further, the speed and switching delay of the inverters 703a-c varies based on the supply current provided to the inverters 703a-c, and the oscillation frequency of the signal propagating through the oscillator ring correspondingly varies based on the supply current provided to the inverters 703a-c. Hence, the oscillation frequency of the oscillator ring and of the VCO 709 is adjustably determined by the supply current provided to the inverters 703a-c, and is based on the current control signal received by the second current source 705.

The current source 701 may have a high output impedance and good power-supply ripple rejection. The current source 701 feeds the ring oscillator and sets the approximate center channel frequency of the VCO 709. The additional voltage controlled current source 705 generally draws a current that has an amplitude much smaller than the current amplitude of the current source 701, and the additional current source 705 can thus be used for PLL loop tuning via current control. In the illustrative circuit of FIG. 7, the VCO 709 is a current-controlled VCO. Advantages of the current controlled VCO over a voltage supply controlled VCO include lower frequency/voltage gain, natural power supply rejection, and simple summing for multiple control inputs (e.g., coarse frequency adjustments, integral control, and proportional control).

Alternatively, a voltage controlled VCO or other architecture can be used for VCO 709. For example, the VCO 709 can be realized using a combined inductor and capacitor (LC) oscillator that offers great stability, power supply rejection, and low phase noise at the expense of large inductor die area, high current, and sensitivity to magnetic fields. As device geometries shrink, the inductor die area becomes a larger portion of the overall die cost and in some applications is unacceptably too expensive. Furthermore, large inductors can inductively couple with bond wires, other inductors, or external circuitry (e.g., fluorescent lights, DC-DC converters) resulting in added noise, local oscillator (LO) feed-through, and a corrupted frequency spectrum. As such, the alternative approach of using a ring oscillator as shown in FIG. 7 may be advantageous. The ring oscillator requires far less die area, consumes less power, and exhibits much less inductive coupling. Drawbacks of ring oscillators include much higher phase noise because the effective oscillation quality factor Q is low, and lower power supply rejection due to a high frequency sensitivity to supply. However, the transmitter 100 of FIG. 1 counteracts the phase noise in the VCO 109 because the fast PLL sampling loop used for phase tracking also attenuates the phase noise.

Figure 9:
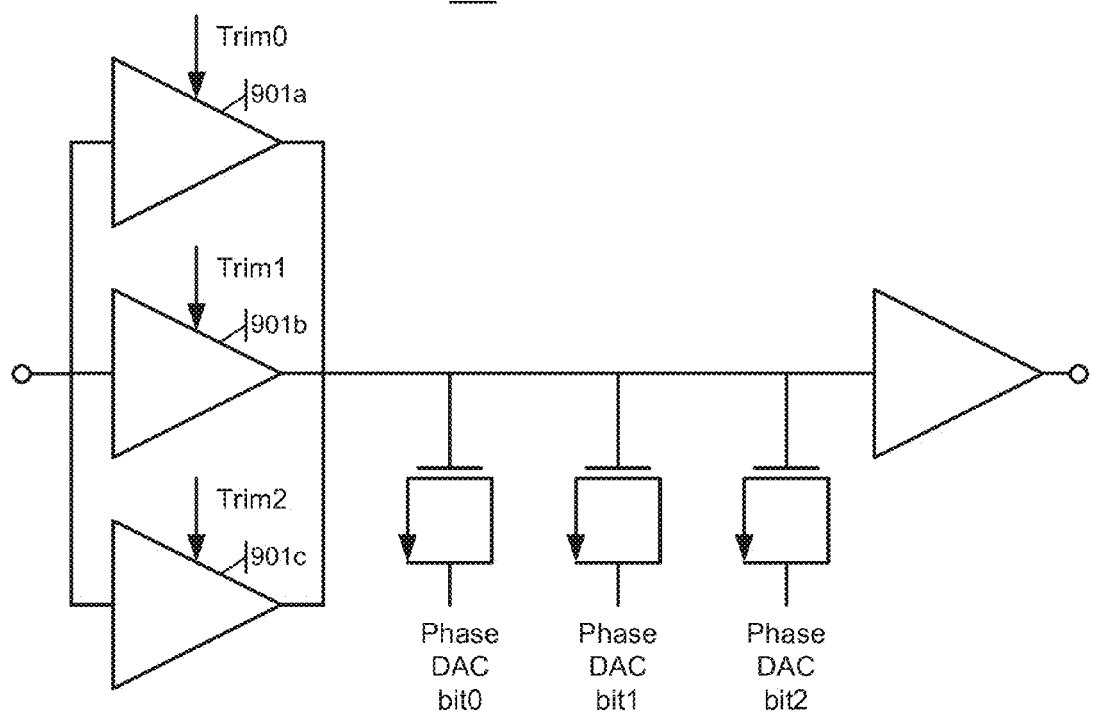

FIGS. 8 and 9 show examples of phase DACs that may be used as the phase DACs in any of transmitters 100-600. With finer line CMOS geometries, the phase DAC can be realized using several techniques. A signal can be delayed by, among other methods, using (a) a varactor, (b) a MOS gate, (c) a MOS triode resistor, (d) or current starving.

FIG. 8 shows an example of a phase DAC 819 that operates based on the MOS gate method. Phase DAC 819 includes two inverters 801 and 803 that are coupled in series. The input of the phase DAC 819 is coupled to the input of inverter 801, and the output of the phase DAC 819 is coupled to the output of the inverter 803. The line connecting the output of inverter 801 with the input of inverter 803 is loaded by a plurality of capacitors. In FIG. 8, the capacitors are formed using the gate terminals of MOS transistors 805*a-c*.

Each MOS capacitor/transistor 805*a-c* is individually addressable and is activated by a bit of the phase DAC digital control signal. When a MOS capacitor/transistor 805*a-c* is deactivated (e.g., the corresponding bit of the phase DAC digital control signal is low or '0'), the MOS capacitor/transistor 805*a-c* creates a capacitive load on the output of the inverter 801 and slows down the switching of the inverter 801. Conversely, when a MOS capacitor/transistor 805*a-c* is activated (e.g., the corresponding bit of the phase DAC digital control signal is high or '1'), the capacitive load of the MOS capacitor/transistor 805*a-c* is minimized and the inverter 801 is thus able to switch states more quickly. In turn, the switching of a signal at the output of inverter 803 is dependent on the inverter's input reaching a predetermined threshold—and thus on the output of inverter 801 reaching the predetermined threshold. By selectively activating different combinations of the MOS capacitor/transistor 805*a-c*, the time taken to reach the predetermined threshold can be varied. Hence, the input-output delay of the phase DAC 819 can be varied.

In general, the MOS capacitor/transistors 805*a-c* have different sizes in order to extend the range of delays that the phase DAC 819 can provide. A large MOS capacitor/transistor 805*a-c* will provide a large capacitive load on the output of inverter 801 and will therefore provide a longer delay; conversely, a smaller MOS capacitor/transistor 805*a-c* will provide a smaller capacitive load and shorter delay. In one example, the MOS capacitor/transistor 805*a-c* are binary weighted such that MOS capacitor/transistor 805*b* has twice the capacitance (e.g., twice the size) of MOS capacitor/transistor 805*a*, and MOS capacitor/transistor 805*c* has four times the capacitance/size of MOS capacitor/transistor 805*a*. Using n binary-weighted MOS capacitor/transistors, $2^n$ different digitally-adjustable delay values can be selected. While the phase DAC 819 is illustratively shown as having three MOS capacitor/transistor 805*a-c*, fewer or more MOS capacitor/transistors can be included in order to extend the range (and/or the resolution) of the phase DAC 819. For example, smaller MOS capacitor/transistors (e.g., having sizes of ½, ¼, . . . of the MOS capacitor/transistor 805*a*) can be added to increase the resolution of the phase DAC 819, while larger MOS capacitor/transistor (e.g., having sizes of 8×, 16×, . . . the MOS capacitor/transistor 805*a*) can be added to increase the range of delays that the phase DAC 819 can provide.

Inverter 801 of phase DAC 819 is powered by current sources 807*a* and 807*b*. In general, current sources 807*a* and 807*b* respectively output and draw currents of a same amplitude. In the embodiment shown in FIG. 8, the current sources 807*a* and 807*b* are adjustable current source that can output currents with adjustably variable amplitudes. The amplitude of the current provided by the current sources 807*a* and 807*b* can be used to vary the delay provided by the phase DAC 819 by current starving the phase DAC 819. For example, by increasing the current provided by the current sources 807*a* and 807*b*, the inverter 801 can switch states more quickly and the delay provided by the phase DAC 819 will be shorter. Conversely, by decreasing the current provided by the current sources 807*a* and 807*b*, the inverter 801 will switch states more slowly and the delay provided by the phase DAC 819 will be longer. Hence, current sources 807*a* and 807*b* can be adjusted to vary the range (and/or the resolution) of the phase DAC 819. Additionally, current sources 807*a* and 807*b* can be adjusted to adjust the delay provided by the phase DAC 819 (e.g., the full-range delay provided by the phase DAC 819, such as the maximum delay provided by the phase DAC 819 when all MOS capacitor/transistors are activated). Specifically, the current sources 807*a* and 807*b* can be adjusted to adjust the delay provided by the phase DAC 819 in order to set the full-range delay of the phase DAC 819 to precisely correspond to one period of the RF signal. More detail on such adjustments are provided below.

FIG. 9 shows an alternative example of a phase DAC 919 that operates based on the MOS gate method. Phase DAC 919 is substantially similar to phase DAC 819, but includes three different inverters 901*a-c* that replace the single input inverter 801. The inverters 901*a-c* can be individually activated by control signals Trim0, Trim1, and Trim2. Specifically, the inverters 901*a-c* can be individually activated in order to vary the delay provided by the phase DAC 919. For example, by activating more numerous (and/or faster/larger) inverters 901*a-c*, the inverters can jointly switch states more quickly and the delay provided by the phase DAC 919 will be shorter. Conversely, by activating fewer (and/or slower/smaller) inverters 901*a-c*, the inverters will jointly switch states more slowly and the delay provided by the phase DAC 919 will be longer. Hence, the selective activation of inverters 901*a-c* can be used to vary the range (and/or the resolution) of the phase DAC 919. Additionally, the selective activation of inverters 901*a-c* can be used to adjust the full-range delay provided by the phase DAC 919. Specifically, the inverters 901*a-c* can be selectively activated to adjust the delay provided by the phase DAC 919 in order to set the full-range delay of the phase DAC 919 to precisely correspond to one period of the RF signal. More detail on such adjustments are provided below.

While FIG. 9 shows the use of three inverters 901a-c coupled in parallel, more (or fewer) inverters can be coupled in parallel and used in accordance with the selective activation methods described above. Further, the inverters 901a-c may be designed to have sizes, capacities, and/or speeds that are selected in order to further extend the range and/or resolution of the phase DAC 919. In one example, the inverters 901a-c are binary weighted such that inverter 901b has twice the size, speed, or capacity of inverter 901a, and inverter 901c has four times the size, speed, or capacity of inverter 901a. Using n binary-weighted inverters, $2^n$ different digitally-adjustable delay values can be selected for the phase DAC 919 by selectively activating different combinations of the n inverters.

In both phase DACs 819 and 919, calibration trim for process and temperature variation can be accomplished by using several driver inverters with different dimensions. An entirely different phase DAC architecture uses inverter chains to delay the signal and a multiplexer (MUX) to select which delay output to use. In general, the phase DAC is designed to be linear, although the phase trajectory digital input could correct for nonlinearity as described above. The advantages of the designs shown in FIGS. 8 and 9 include very low current consumption at the 40 MHz loop sample rate, high possible resolution, and adequate power supply rejection. In some embodiments the phase DAC is binary weighted, thermometer coded, or constructed from multiple copies of these phase DACs cascaded in series for increased tuning range. Transistor scaling allows a faster phase-locked loop update rate and 1-2 pico-second resolution phase DACs without compromising power efficiency.

In general, the full-scale range of the phase DAC (e.g., 360 degrees with respect to the VCO output frequency) may be calibrated to correspond exactly to one period of the RF signal output by the VCO 109. If the full-scale range does not precisely correspond to one period of the RF signal, a phase glitch may occur during phase wrapping and the phase glitch may impact the spectral mask. However, if the phase DAC 119 is precisely calibrated, then switching the phase DAC 119 between 0 degrees and 360 degrees of phase is identical to the frequency divider 117 switching between N counts and N+1 counts for one period. Hence, setting the frequency divider 117 to N and the phase DAC 119 to 360 degrees for one reference period and then setting the frequency divider count to N+1 and the phase DAC 119 to 0 degrees for the next reference period would not change the PLL loop delay or VCO frequency.

In contrast, if the scale factor of the phase DAC 119 is too high, the setting of the frequency divider 117 to N and the phase DAC 119 to 360 degrees would provide a longer delay than the setting of the frequency divider 117 to N+1 and the phase DAC 119 to 0 degrees. In such a situation, the PLL loop may switch between the longer delay and the short delay as the two cases alternate. Similarly, if the scale factor of the phase DAC 119 is too low, then the PLL loop will alternate between short delay and long delay but with a reverse polarity relative to the situation in which the scale factor of the phase DAC is too high. Alternating error can also be created by continuously ramping the phase in one direction (e.g., continuously increasing the phase, or continuously decreasing the phase, which is equivalent to a frequency offset from the channel center). Each time the phase wraps, there may be a repeated phase glitch if the full-scale range of the phase DAC 119 does not precisely correspond to one period of the RF signal output by the VCO 109.

Various approaches may be used to detect situations in which alternating error occurs as described above. One approach is to use an external RF analyzer to demodulate the VCO output to thereby provide frequency or phase. The alternating between the two divider/DAC cases may cause a small frequency or phase perturbation. The phase DAC scale factor can be adjusted until these perturbations are minimized as measured by the external equipment. Alternately, rather than use external equipment, the detection of alternating error and the trimming of the phase DAC's full-scale range can be done using on-chip built-in test circuits. One method for translating the alternating delay error into a control voltage includes using the output signals from the PD 105 already in the PLL loop to drive an additional charge pump (not shown). If the inputs to the additional charge pump are chopped synchronously with frequency divider count alternation, then a high phase DAC scale factor will drive the charge pump voltage high while a low phase DAC scale factor will drive the charge pump low. This charge pump output voltage can be used in a control loop to adjust the full-scale range of the phase DAC 119. An additional phase detector (PD) or multiplier can also be used to sense the alternating delay errors instead of using the PD 105 of the PLL loop.

The phase DAC trimming method described above may be dependent on the operational characteristics of the charge pump and PD, since mismatch and offsets between the charge pump and PD may cause errors. An alternative approach uses positive feedback and the PLL circuitry to avoid mismatch error. In this approach, the PLL is firstly allowed to lock using divider N and phase DAC 360 degree settings. Next, the PLL loop polarity is switched to positive feedback (e.g., the polarity of the input to the PD 105 connected to the phase DAC 119 is changed from an inverting input to a non-inverting input). With the PLL loop polarity switched, the frequency divider 117 is switched to N+1 and the phase DAC 119 is switched to 0 degrees for one period. Then, the frequency divider 117 and phase DAC 119 are switched back to divide by N and 0 degrees, respectively. If scale factor error is present and results in a positive charge injection, then the positive feedback will drive the loop high. Conversely, if scale factor error is present and is of the opposite polarity, a negative charge injection will occur and the loop will move low. The full-scale of the phase DAC 119 can then be trimmed according to the polarity of the charge injection to reach a level of zero charge injection (or charge injection less than a threshold) in response to switches in loop polarity.

A further approach includes monitoring the VCO control voltage created by the PLL during normal operation (i.e., monitoring the voltage at the VCO's input node). When switching occurs between the two cases (N/360° and N+1/0°) as described above, a glitch generally occurs on the control voltage which can be observed. Circuitry used to monitor the VCO input control voltage can detect the glitch. The voltage change is small, so careful offset zeroing, chopping, averaging, and/or integration may be needed to detect the error. Any phase wrap can also cause a glitch which can be measured by this technique.

Another different approach includes calibrating the phase DAC directly. First, switches are used to disconnect the phase DAC 119 from the PLL frequency divider 117 and connect it to a buffered version of the VCO signal. Switches are used to close the PLL loop by creating a signal short to replace the phase DAC 119 with a direct connection between the output of the frequency divider 117 and the input of the PD 105. Next a phase detector (PD) is placed across the input and output of the phase DAC 119. The input of the phase DAC and one side of the PD is the buffered VCO signal. The output of the phase DAC and the second phase detector input is the phase delayed VCO signal. If the phase DAC scale factor is precisely equal to one VCO period, then the input and output signals will be coincident (the phase DAC has exactly one period delay). Any discrepancy can be trimmed by adjusting the phase DAC scale until the phase detector inputs are coincident. If device matching is adequate, then a phase DAC replica might be used instead of disconnecting the phase DAC 119 from the PLL loop.

In yet another example, the measurement of a phase DAC transfer function (e.g., a transfer function relating digital bits of the input digital signal to the phase delay of the VCO output signal) may be completed using two PLLs having a common frequency reference. The phase DAC to be characterized is placed in the first loop. A second loop is run with an integer division ratio (and, if the second loop has a phase DAC, a constant phase DAC setting), for example a divisor of N, with the phase DAC delay set to be constant and set to 0. The second loop thereby provides a constant frequency reference of $F_1$. The loop to be characterized, i.e. the first loop, is placed in an identical configuration. Since both PLLs have the identical frequency reference and are configured identically, their outputs should exhibit identical phase. In practice, however, a static offset and phase noise between the loops will cause the phases of the first and second loops to deviate from each other. This phase deviation can be measured by, for example, multiplying a buffered output signal from the first loop's VCO against a buffered output signal output from the second loop's VCO. The output of this multiplication operation will have a value which will vary according to the relative phase of the two outputs. Measurement may be digital or analog or a combination (e.g., an analog multiplication followed by an ADC and digital processing; digital only may operate by having one output sample the other using a flip flop (or other quantizer); phase noise may be added to whiten the sampled output to allow quantization noise to be filtered out by following the sampler by a digital filter). The multiplier output can be measured and thereby yield a first measurement cal_Phase1. Next, the phase DAC of the first loop is incremented by a single count. The difference in the multiplier output changes by an amount affected by the relative phase change; the configuration is effectively synchronous demodulation with varying phase. The multiplier output is measured again resulting in cal_Phase2. The difference between the two measurements cal_Phase1 and cal_Phase2, and other measurements like them present a means for high resolution measurement of the effect of changes in phase DAC input to delay output, effectively transforming the phase coordinate system to a rotating basis function at the phase trajectory provided for by the second reference loop. In alternative embodiments, the first loop can be used to calibrate the second loop's phase DAC.

The phase DAC scale factor may be adjusted in either the digital or analog domain. The phase DAC scaling or overflow set-point can be digitally varied until the error is nearly zero. Alternately, the phase DAC scale factor may be digitally adjusted by mapping the digital-input phase word to a corresponding DAC control word to compensate. Instead of digital adjustment, the phase DAC analog scale factor may be adjusted to thereby keep the same digital range. The phase DAC scale factor may be adjusted by tuning a signal in the analog domain (e.g., adjusting a voltage or current resulting in a change in the drive strength of the inverters shown in FIG. 8 or FIG. 9). Phase DAC nonlinearity (e.g., differential nonlinearity (DNL) and integral nonlinearity (INL)) can also be compensated for both in the analog and the digital domain. For example, nonlinearity can be digitally compensated for by adjusting the mapping between digital-input phase word and the DAC control word.

With regard to trimming phase DAC nonlinearity, several approaches may be taken to improve linearity of the phase DAC 119. If the phase DAC 119 includes repeated elements (e.g., a plurality of equal delay elements coupled in series), then nonlinearity calibration can be done by equalizing the phase shift due to each element. For example, the PLL can be run while alternating between two different phase DAC elements which should have the same phase delay. If the error measurement by the PD 105 is flat or constant, then the elements are equal and introduce the same amount of phase as each other. If the PD error measurement alternates between positive and negative values, then the elements are not equal and can be trimmed to improve the match between the elements. The positive/negative alternation can be detected by a circuit which (1) chops and filters the signal, (2) zeros for one element and then samples for the other element, or, (3) takes the difference between one element and the other.

FIGS. 10-16 are plots of simulations performed on the transmitters of FIGS. 1-6. Specifically, the transmitter 300 of FIG. 3 was modeled to validate the approach and optimize the architecture and design. The model included the VCO dynamics, the PLL frequency divider, the in-loop phase DAC, the integral/proportional control charge pumps, and the RF output divide by 2 frequency divider (used to convert 5 GHz to 2.5 GHz). The bandwidth of the PLL loop is used to set the filtering for the phase trajectory. Varying charge pump currents adjust the PLL bandwidth. All simulations used a 7-bit phase DAC with a 40 MHz sample rate. The phase DAC scale is 360/200 degrees per code. Non-idealities including phase noise, DAC scale error, and charge pump offsets were included in the model.

Three different scenarios and output RF signals were considered as part of the measurements: (1) Standard IEEE 802.15.4 OQPSK at 2 Mchip/sec, (2) Gaussian minimum shift keying (GMSK) at 4 Mchip/sec, and (3) Bluetooth Classic at 1 Mchip/sec.

Case 1: IEEE 802.15.4 OQPSK at 2 Mchip/sec

The IEEE 802.15.4 standard uses OQPSK with half-sine pulse shaping modulation with sixteen 5 MHz-spaced channel centers between 2.405 to 2.48 GHz. Through a mathematical transformation, OQPSK with half-sine pulse shaping can be translated into MSK which is a special case of frequency shift keying (FSK). The modulation uses a higher frequency for 1's and a lower frequency for 0's. Phase is the time integral of frequency, so the phase trajectory is a sequence of ascending or descending ramps. The simplest approach would be to have 1's ramping up and 0's ramping down piecewise. However, a better approach is to use chip pairs (00, 01, 10, 11) instead because an optimum trajectory shape can be chosen for the phase reversals (01 and 10).

Figure 10:
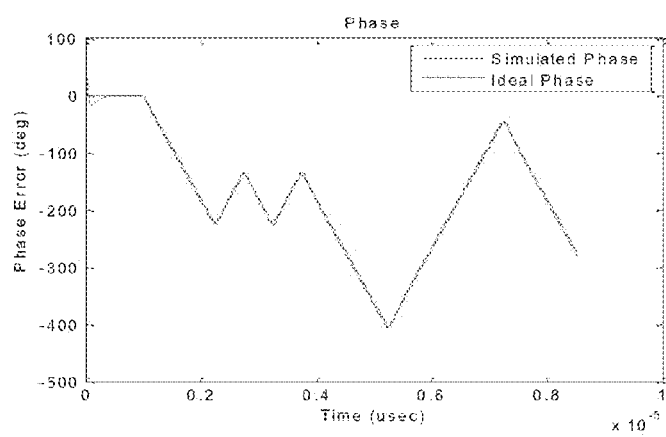
FIGS. 10-16 are plots of performance taken during simulated operation of the transmitter of FIG. 3.
Figure 11:
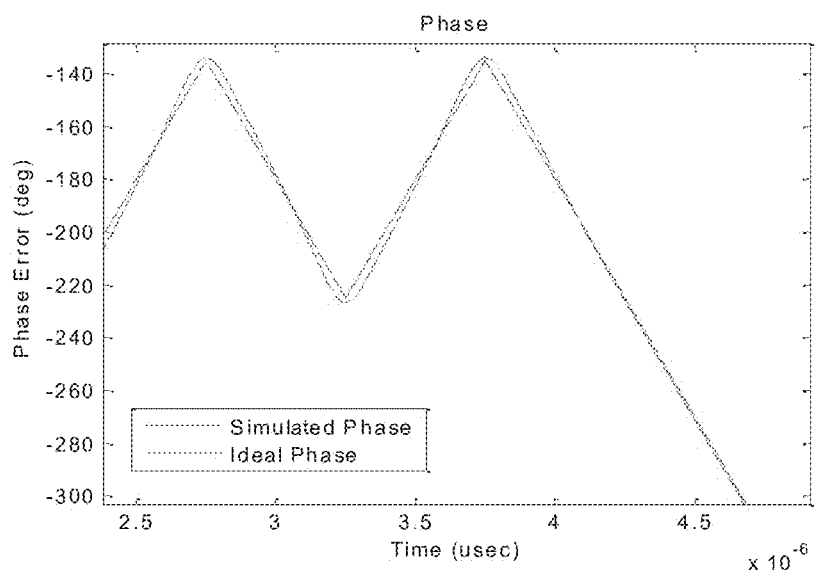
Figure 12:
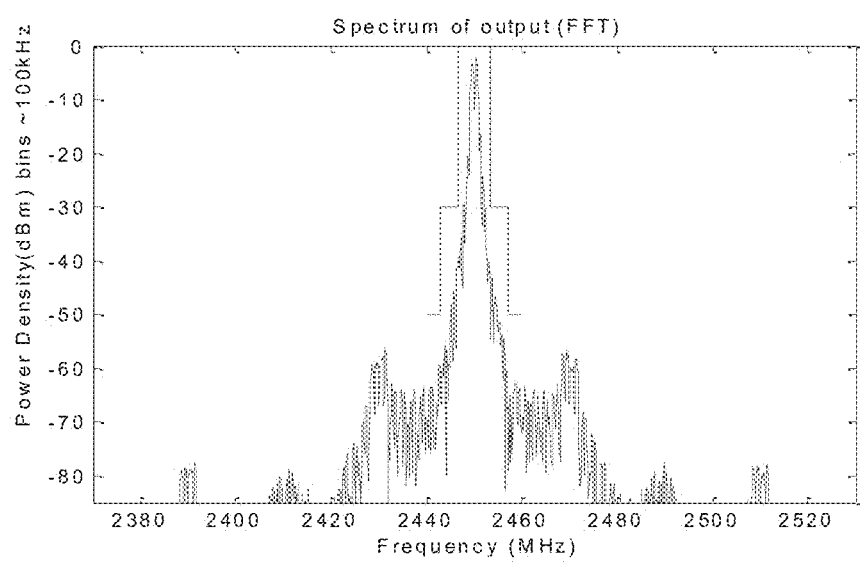

FIG. 10 shows results from a IEEE 802.15.4 simulation with an initial phase locking transient (between 0 and 0.1 usec) followed by phase trajectory tracking of a chip sequence [0,0,0,1,0,1,0,0,0,1,1,1,1,0,0,0]. The measurements of FIG. 10 are shown relative to an ideal phase trace. FIG. 11 shows a close-up of trajectory tracking, shown relative to an ideal phase trace. The system was optimized for good tracking along the trajectory, but particularly low error at the chip decision points resulting in error vector magnitude of 4% ideally and less than 7% with error modeling. FIG. 12 shows the simulated power spectrum at 8 dBm for the trajectory, shown relative to a power spectral mask. The spectrum has a tighter span and smaller lobes than a standard OQPSK transmission because the reversal peaks and valleys are slightly smoothed by the (e.g. limited bandwidth of the) controller. The controller bandwidth was 2 MHz for this simulation.

Case 2: GMSK at 4 Mchip/sec

Figure 13:
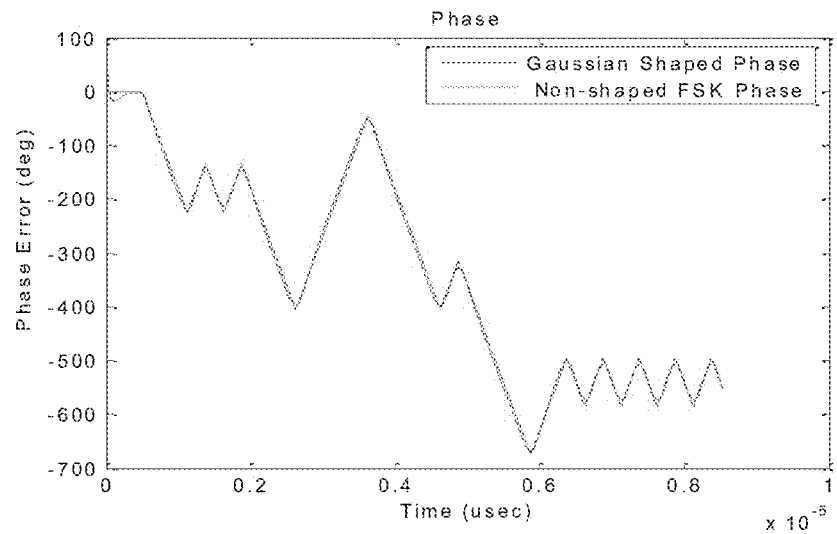
Figure 14:
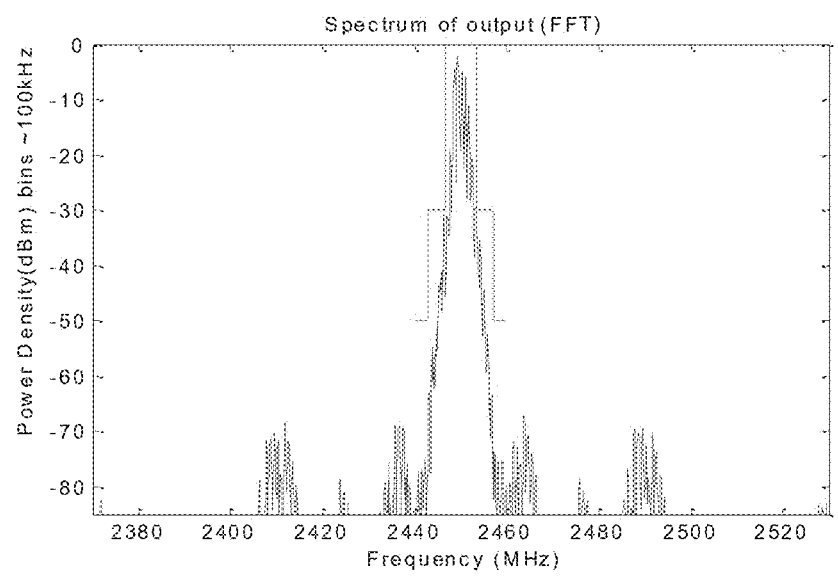

The proposed transmitter can modulate signals at higher chip rates and provide an arbitrary level of Gaussian smoothing. FIG. 13 shows a trajectory with 4 Mchip/sec GMSK with a modulation index of 0.5 and BT=0.5 (BT is a measure of Gaussian smoothing). The Gaussian shaped GMSK is shown relative to MSK phase in FIG. 13. FIG. 14 shows the simulated power spectrum at 8 dBm. The controller bandwidth was 2 MHz for this simulation. Because GMSK is more spectrally efficient, the GMSK 4 Mchip/sec signal has about the same channel width as the half rate IEEE 802.15.4 2 Mchip/sec channel width. Hence, twice the data rate can be transmitted in the same bandwidth.

Case 3: Bluetooth Classic at 1 Mchip/sec

Figure 15:
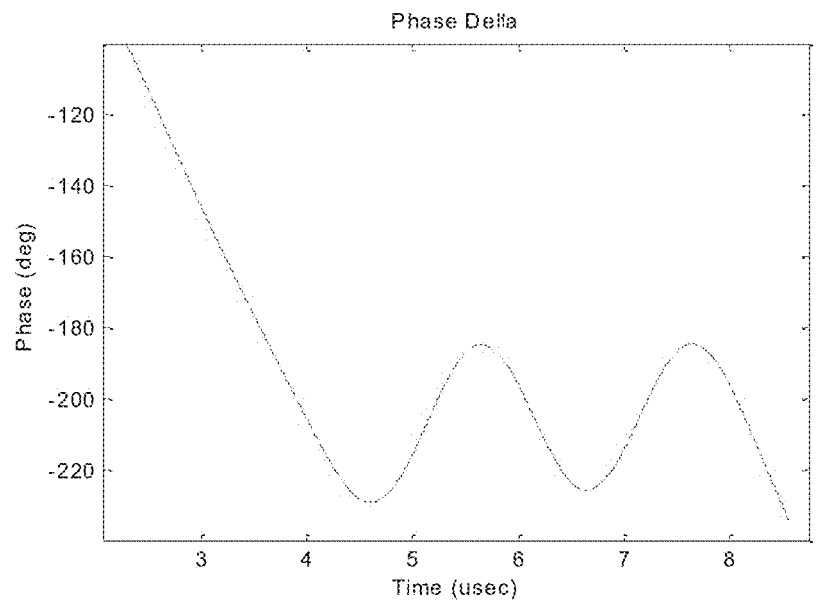
Figure 16:
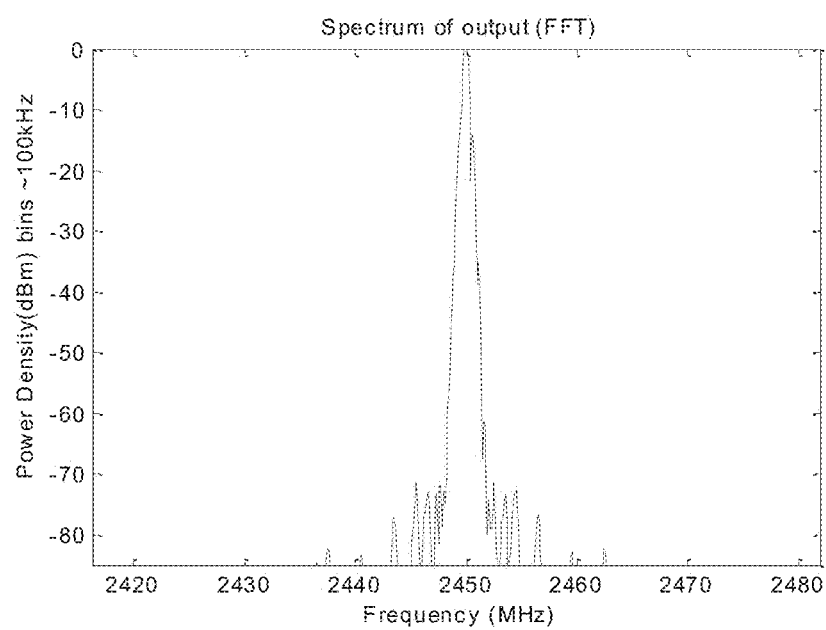

The final simulation example is for Bluetooth classic. This is GFSK with 1 Mchip/sec, modulation index of 0.32, and a Gaussian smoothing BT=0.5. The charge pump currents were reduced to provide a PLL loop bandwidth of 0.5 MHz to smooth the phase DAC quantization error for the slower signals. The low PLL loop bandwidth will also smooth any sub-LSB (least-significant bit) interpolation of the DAC levels using dithering (e.g., alternating between two adjacent DAC codes via pulse code modulation, or delta sigma modulation, at a rate higher than the desired signal bandwidth to attain a finer in-band signal resolution than the DAC provides alone). The disadvantage of a lower PLL loop bandwidth is increased phase noise since the PLL will not attenuate as much noise power. FIG. 15 shows the Bluetooth trajectory, and FIG. 16 shows the narrow 1 MHz channel power spectrum at 8 dBm.

The transmitters 100-600 shown in and described in relation to FIGS. 1-6 can be implemented using circuit components such as those shown in FIGS. 7-9, for example. In general, the transmitters 100-600 will be manufactured as integrated circuits fabricated on integrated circuit substrates and mounted in integrated circuit packages. In some examples, the integrated circuits and packages including the transmitters 100-600 will be single-purpose circuits that include only circuitry for implementing the transmitters 100-600. In other examples, the integrated circuits and packages including the transmitters 100-600 will include circuitry other than the circuitry of the transmitters 100-600, for example a processor, a memory, an auxiliary analog function such as temperature measurement, an auxiliary digital function such as encryption or addition of two numbers. In further examples, the reference clock 103 of transmitters 100-600 may be external to the integrated circuit, and the reference clock signal produced by clock 103 may be received as an input signal (e.g., via a lead pin or other input) to the integrated circuit implementing the remainder of transmitters 100-600.

In various embodiments, the devices, systems, and techniques described herein are used to synthesize a frequency that is used for applications other than radio transmission. Indeed, the teachings described herein can broadly be applied to general techniques of frequency synthesis of an arbitrary frequency, or, equivalently, an arbitrary phase trajectory, given a first frequency reference. For example, the output signal of the VCO 109 may be used to provide a frequency reference for RF conversion using a mixer; the output signal of the VCO 109 may be used to provide a frequency reference for an analog-to-digital (ADC) or DAC sampling operation; the output signal of the VCO 109 may be used to generate, from a first frequency reference, a second frequency reference; in some embodiments, the second frequency reference is not integer-related to the first frequency reference but may be required to conform to a standard. In some embodiments, the generated frequency reference is static; some embodiments make use of a changing or modulated generated frequency reference.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element. Elements that are described as being "coupled" may be directly coupled to each other such that no other element is coupled between them (other than a conductive trace, wire, or the like used to electrically couple the elements); alternatively, elements that are coupled may be indirectly coupled to each other through one or more intermediate elements such that an electrical signal output by one element is processed by the one or more intermediate elements before being provided to the other element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A frequency synthesizer comprising:
a voltage controlled oscillator (VCO) producing at an output thereof a synthesized frequency signal having a frequency controlled based on a signal received at an input of the VCO;
a digitally adjustable frequency divider coupled to the output of the VCO and producing at an output thereof a reduced frequency signal from the synthesized frequency signal;
a phase digital-to-analog converter (DAC) receiving a timing signal and a digital control signal, and producing at an output thereof a delayed version of the timing signal that is delayed according to the digital control signal;
a phase detector (PD) coupled to the output of the digitally adjustable frequency divider, the output of the phase DAC, and a reference clock, and producing a phase control signal at an output of the PD coupled to the input of the VCO; and
a digital signal converter operative to control the digitally adjustable frequency divider and the phase DAC so as to cause a phase or frequency of the synthesized frequency signal output by the VCO to track a desired phase or frequency trajectory encoded in a digital signal received by the digital signal converter.

2. The frequency synthesizer of claim 1, wherein the digital signal converter determines when a delay threshold is reached by the phase DAC, and adjusts a frequency division of the digitally adjustable frequency divider in response to determining that the delay threshold is reached by the phase DAC.

3. The frequency synthesizer of claim 2, wherein, when the digital signal converter determines that a maximum delay threshold is reached by the phase DAC, the digital signal converter reduces the digitally adjustable delay of the phase DAC and increases the frequency division of the digitally adjustable frequency divider.

4. The frequency synthesizer of claim 3, wherein, when the digital signal converter determines that the maximum delay threshold is reached by the phase DAC, the digital signal converter reduces the digitally adjustable delay of the phase DAC by a length of time equal to one period of the synthesized frequency signal output by the VCO.

5. The frequency synthesizer of claim 2, wherein, when the digital signal converter determines that a minimum delay threshold is reached by the phase DAC, the digital signal converter increases the digitally adjustable delay of the phase DAC and decreases the frequency division of the digitally adjustable frequency divider.

6. The frequency synthesizer of claim 1, wherein the phase DAC receives as the timing signal the reduced frequency signal from the digitally adjustable frequency divider, and outputs directly to the PD a delayed version of the reduced frequency signal.

7. The frequency synthesizer of claim 1, wherein the phase DAC receives as the timing signal the reference clock signal, and outputs to the PD a delayed version of the reference clock signal.

8. The frequency synthesizer of claim 1, further comprising:
a charge pump coupled between the output of the phase detector and the input of the VCO, and operative to filter the phase control signal to provide a filtered phase control signal at the input of the VCO.

9. The frequency synthesizer of claim 1, wherein:
the digital signal converter comprises a digital accumulator having a predetermined range,
the digital signal converter controls the phase DAC based on a value stored in the accumulator, and
the digital signal converter controls the digitally adjustable frequency divider based on an overflow or an underflow condition of the accumulator reaching an upper limit or a lower limit of the predetermined range.

10. The frequency synthesizer of claim 1, wherein the delayed version of the timing signal output by the phase DAC controls the input of the VCO via the PD.

11. The frequency synthesizer of claim 1, wherein the digitally adjustable frequency divider is adjustable to increment, decrement, or hold steady a frequency ratio applied to the synthesized frequency signal.

12. A method comprising:
producing, in a voltage controlled oscillator (VCO) of a frequency synthesizer, a synthesized frequency signal having a frequency controlled based on a signal received at an input of the VCO;
producing, in a digitally adjustable frequency divider coupled to an output of the VCO, a reduced frequency signal from the synthesized frequency signal;
producing, in a phase digital-to-analog converter (DAC) receiving a timing signal and a digital control signal, a delayed version of the timing signal that is delayed according to the digital control signal;
producing, in a phase detector (PD) coupled to outputs of the digitally adjustable frequency divider, of the phase DAC, and of a reference clock, a phase control signal and coupling the phase control signal to the input of the VCO; and
controlling, by a digital signal converter receiving a digital signal, the digitally adjustable frequency divider and the phase DAC so as to cause a phase or frequency of the synthesized frequency signal output by the VCO to track a desired phase or frequency trajectory encoded in a digital signal received by the digital signal converter.

13. The method of claim 12, further comprising:
determining, in the digital signal converter, whether a delay threshold is reached by the phase DAC, and
adjusting a frequency division of the digitally adjustable frequency divider in response to determining that the delay threshold is reached by the phase DAC.

14. The method of claim 13, wherein the adjusting comprises:
when a maximum delay threshold is reached by the phase DAC, reducing the digitally adjustable delay of the phase DAC and increasing the frequency division of the digitally adjustable frequency divider.

15. The method of claim 14, wherein, when the maximum delay threshold is reached by the phase DAC, the digitally adjustable delay of the phase DAC is reduced by a length of time equal to one period of the synthesized frequency signal.

16. The method of claim 13, wherein the adjusting further comprises:

when a minimum delay threshold is reached by the phase DAC, increasing the digitally adjustable delay of the phase DAC and decreasing the frequency division of the digitally adjustable frequency divider.

17. The method of claim 12, wherein the timing signal received by the phase DAC is the reduced frequency signal produced by the digitally adjustable frequency divider, and
the method further comprises outputting to the PD a delayed version of the reduced frequency signal.

18. The method of claim 12, wherein the timing signal received by the phase DAC is a reference clock signal from the reference clock, and
the method further comprises outputting directly to the PD a delayed version of the reference clock signal.

19. The method of claim 12, further comprising:
filtering the phase control signal produced by the PD, and
providing the filtered phase control signal to the input of the VCO.

20. The method of claim 12, wherein:
the controlling of the phase DAC comprises controlling the phase DAC based on a value stored in a digital accumulator receiving the digital signal, and
the controlling of the digitally adjustable frequency divider comprises controlling the digitally adjustable frequency divider based on an overflow or an underflow condition of the accumulator reaching an upper limit or a lower limit of a predetermined range of the accumulator.

* * * * *